United States Patent
Lee

(10) Patent No.: US 12,396,324 B2
(45) Date of Patent: Aug. 19, 2025

(54) THIN FILM TRANSISTOR AND DISPLAY DEVICE INCLUDING THE SAME

(71) Applicant: LG Display Co., Ltd., Seoul (KR)

(72) Inventor: Seung-Min Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 237 days.

(21) Appl. No.: 17/121,320

(22) Filed: Dec. 14, 2020

(65) Prior Publication Data

US 2021/0202910 A1 Jul. 1, 2021

(30) Foreign Application Priority Data

Dec. 30, 2019 (KR) .................. 10-2019-0177271

(51) Int. Cl.
*H10K 59/121* (2023.01)
*H10D 30/67* (2025.01)
(Continued)

(52) U.S. Cl.
CPC ....... *H10K 59/1213* (2023.02); *H10D 86/431* (2025.01); *H10D 86/60* (2025.01); *H10K 50/846* (2023.02); *H10D 30/6734* (2025.01); *H10D 30/6755* (2025.01); *H10K 59/123* (2023.02); *H10K 59/126* (2023.02)

(58) Field of Classification Search
CPC . H01L 29/7869–78693; H01L 51/5259; H01L 27/1237; H01L 27/3262; H01L 27/3272; H01L 27/3248; H01L 29/78648; H01L 29/42384; H10K 50/846; H10K 59/874; H10K 59/1213; H10K 59/123; H10K 59/126; H10D 86/431; H10D 86/60; H10D 30/67–6759
See application file for complete search history.

(56) References Cited

U.S. PATENT DOCUMENTS

2007/0176227 A1* 8/2007 Liu .................. H01L 29/40114
257/325
2015/0084035 A1 3/2015 Kim et al.
(Continued)

FOREIGN PATENT DOCUMENTS

CN 104465783 A 3/2015
KR 10-2015-0033155 A 4/2015

OTHER PUBLICATIONS

China National Intellectual Property Administration, Office Action, Chinese Patent Application No. 202011457336.2, Dec. 1, 2023, seven pages.

*Primary Examiner* — Sue A Purvis
*Assistant Examiner* — Aneta B Cieslewicz
(74) *Attorney, Agent, or Firm* — Fenwick & West LLP

(57) ABSTRACT

A display device includes a substrate, a semiconductor layer on the substrate, a gate insulating layer on the semiconductor layer, a first upper hydrogen blocking layer on the gate insulating layer and having a positive hydrogen formation energy, a first upper hydrogen capturing layer on the first upper hydrogen blocking layer corresponding to a central portion of the semiconductor layer and having a negative hydrogen formation energy, a gate electrode on the first upper hydrogen capturing layer, a source electrode and a drain electrode connected to both end portions of the semiconductor layer, and a passivation layer on the gate electrode, the source electrode and the drain electrode.

20 Claims, 10 Drawing Sheets

(51) Int. Cl.
  *H10D 86/40* (2025.01)
  *H10D 86/60* (2025.01)
  *H10K 50/84* (2023.01)
  *H10K 59/123* (2023.01)
  *H10K 59/126* (2023.01)

(56) References Cited

U.S. PATENT DOCUMENTS

2020/0227561 A1* 7/2020 Yamazaki ......... H01L 29/78648
2020/0350383 A1* 11/2020 Bang ................... H01L 29/4908
2021/0036086 A1* 2/2021 Sohn ...................... H10K 50/84
2021/0066505 A1* 3/2021 Lee ................... H01L 29/78651
2021/0126183 A1* 4/2021 Chen .................... G02B 26/004

* cited by examiner

THIN FILM TRANSISTOR AND DISPLAY DEVICE INCLUDING THE SAME

CROSS REFERENCE TO RELATED APPLICATIONS

The present application claims the priority benefit of Republic of Korea Patent Application No. 10-2019-0177271 filed in the Republic of Korea on Dec. 30, 2019, which is hereby incorporated by reference in its entirety for all purposes as if fully set forth herein.

BACKGROUND

Technical Field

The present disclosure relates to a thin film transistor, and more particularly, to a thin film transistor and a display device including the thin film transistor where a property deterioration due to a hydrogen is reduced.

Discussion of the Related Art

Recently, a flat panel display (FPD) such as a liquid crystal display (LCD) device, a plasma display panel (PDP) device, an organic light emitting diode (OLED) display device and a field emission display (FED) device having an excellent property of a thin profile, a light weight and a low power consumption has been developed and applied to various fields.

In the FPD, a plurality of subpixels display an image using a gate signal and a data signal, and each subpixel transmits the gate signal and the data signal using a plurality of thin film transistors (TFTs).

The TFT of the FPD includes a semiconductor layer of a semiconductor material such as silicon. Recently, a TFT including a semiconductor layer of an oxide semiconductor material having an excellent element property and a reduced fabrication cost due to simplification of a fabrication process has been researched and developed.

However, the semiconductor layer of the oxide semiconductor material is deteriorated by a hydrogen (H). As a result, an electric property of the TFT is deteriorated and a reliability of the display device is deteriorated.

Specifically, differently from a bottom emission type OLED display device where an encapsulating substrate of a metal is disposed as a top surface thereof, in a top emission type OLED display device where an encapsulating layer a plurality of organic layers and a plurality of inorganic layers is disposed as a top surface thereof, a hydrogen of the encapsulating layer is diffused into the semiconductor layer to deteriorate the semiconductor layer and shift a threshold voltage of the TFT.

SUMMARY

Accordingly, embodiments of the present disclosure is directed to a thin film transistor and a display device including the thin film transistor that substantially obviate one or more of the problems due to limitations and disadvantages of the related art.

An object of the present disclosure is to provide a thin film transistor and a display device including the thin film transistor where a hydrogen is captured by a hydrogen capturing layer between a metal layer and a semiconductor layer.

Another object of the present disclosure is to provide a thin film transistor and a display device including the thin film transistor where a hydrogen is blocked by a hydrogen blocking layer between a hydrogen capturing layer and a semiconductor layer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the present disclosure, as embodied and broadly described herein, a display device includes a substrate, a semiconductor layer on the substrate, a gate insulating layer on the semiconductor layer, a first upper hydrogen blocking layer on the gate insulating layer and having a positive hydrogen formation energy, a first upper hydrogen capturing layer on the first upper hydrogen blocking layer corresponding to a central portion of the semiconductor layer and having a negative hydrogen formation energy, a gate electrode on the first upper hydrogen capturing layer, a source electrode and a drain electrode connected to both end portions of the semiconductor layer, and a passivation layer on the gate electrode, the source electrode and the drain electrode.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings.

Figure 1:
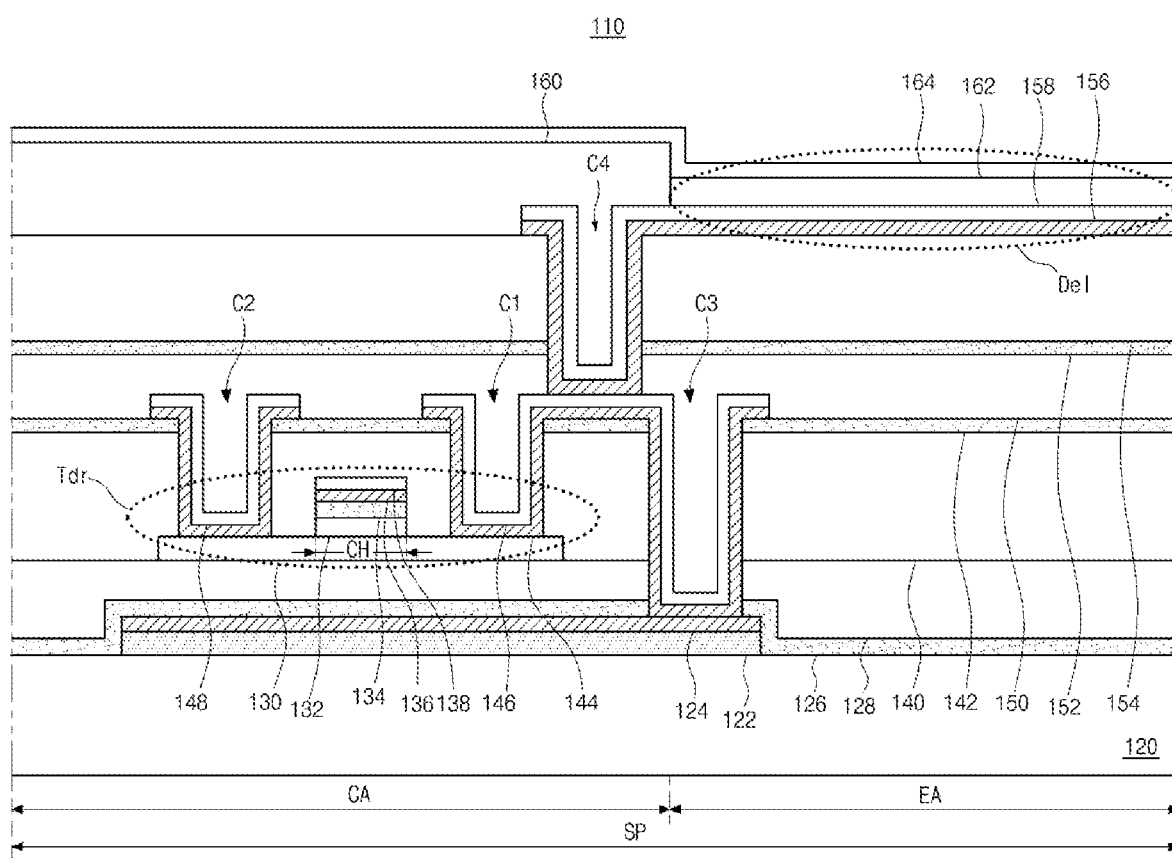
FIG. 1 is a cross-sectional view showing a subpixel of a display device according to a first embodiment of the present disclosure.

FIG. 1 is a cross-sectional view showing a subpixel of a display device according to a first embodiment of the present disclosure.

In FIG. 1, a display device 110 according to a first embodiment of the present disclosure includes a substrate 120, a switching thin film transistor (TFT) (not shown), a driving TFT Tdr, a sensing TFT (not shown), a storage capacitor (not shown) and a light emitting diode (Del).

The substrate 120 includes a plurality of pixels. Each of the plurality of pixels includes a plurality of subpixels SP, and each of the plurality of subpixels SP includes an emission area EA and a circuit area CA.

For example, the substrate 120 may include a glass or a flexible material such as polyimide (PI), and the plurality of subpixels SP may emit a light corresponding to blue, green, red and white colors.

A light shielding layer 122 and a lower hydrogen capturing layer 124 are sequentially disposed in the circuit area CA of each of the plurality of subpixels SP on the substrate 120. The light shielding layer 122 and the lower hydrogen capturing layer 124 may be formed through a single photolithographic process to have the same shape as each other.

The light shielding layer 122 is disposed to overlap a semiconductor layer 130 of each of the switching TFT, the driving TFT Tdr and the sensing TFT to prevent deterioration of the semiconductor layer due to irradiation of an external light through the substrate 120 onto the semiconductor layer 130.

For example, the light shielding layer 122 may include an opaque metallic material such as aluminum (Al), molybdenum titanium (MoTi) and copper (Cu).

The lower hydrogen capturing layer 124 captures a hydrogen (H) diffused from the light shielding layer 122 to the lower hydrogen capturing layer 124 to prevent diffusion of a hydrogen into the semiconductor layer 130. The lower hydrogen capturing layer 124 includes a hydrogen capturing material having a negative (−) hydrogen formation energy.

Since the hydrogen injected into the hydrogen capturing material having a negative (−) hydrogen formation energy is maintained as a stable state, the hydrogen capturing material may capture a peripheral hydrogen capable of diffusing into the semiconductor layer 130 to suppress a hydrogen diffusion.

For example, the lower hydrogen capturing layer 124 may include one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

A lower hydrogen blocking layer 126 is disposed on a whole of the lower hydrogen capturing layer 124 and the substrate 120.

The lower hydrogen blocking layer 126 blocks a hydrogen diffused from the lower hydrogen capturing layer 124 to the lower hydrogen blocking layer 126 and a hydrogen diffused from the substrate 120 or an inorganic material layer on the substrate 120 to the lower hydrogen blocking layer 126 to prevent diffusion of a hydrogen into the semiconductor layer 130.

When an amount of a hydrogen in the lower hydrogen capturing layer 124 exceeds a saturation degree, a hydrogen of the lower hydrogen capturing layer 124 may be diffused into the lower hydrogen blocking layer 126. The lower hydrogen blocking layer 126 may block an excess hydrogen of the lower hydrogen capturing layer 124 to prevent diffusion of a hydrogen into the semiconductor layer 130.

The lower hydrogen blocking layer 126 may have a greater hydrogen formation energy than a peripheral insulating layer. For example, the lower hydrogen blocking layer 126 may have a hydrogen formation energy greater than about 1.0 eV. The lower hydrogen blocking layer 126 may include a hydrogen blocking material having a hydrogen formation energy greater than about 3.5 eV which is a hydrogen formation energy of silicon oxide ($SiO_2$).

For example, the lower hydrogen blocking layer 126 may include one of copper oxide ($CuO_x$), nickel oxide ($NiO_x$), iron oxide ($FeO_x$), cobalt oxide ($CoO_x$), manganese oxide ($MnO_x$), indium oxide ($InO_x$), tin oxide ($SnO_x$), zinc oxide ($ZnO_x$), silver oxide ($AgO_x$), gallium oxide ($GaO_x$) and tungsten oxide ($WO_x$). The lower hydrogen blocking layer 126 may include one of aluminum oxide ($AlO_x$), magnesium oxide ($MgO_x$) and calcium oxide ($CaO_x$).

Although the lower hydrogen blocking layer 126 is disposed on a whole of the substrate 120 in the first embodiment, the lower hydrogen blocking layer 126 may be formed through the same photolithographic process as the light shielding layer 122 and the lower hydrogen capturing layer 124 to have the same shape as the light shielding layer 122 and the lower hydrogen capturing layer 124 in another embodiment.

In yet another embodiment, the lower hydrogen blocking layer 126 may be formed through a photolithographic process different from the light shielding layer 122 and the lower hydrogen capturing layer 124 to be disposed on the light shielding layer 122 and the lower hydrogen capturing layer 124 and to have a shape different from the light shielding layer 122 and the lower hydrogen capturing layer 124.

In yet another embodiment, the lower hydrogen blocking layer 126 may be disposed under the light shielding layer 122 on a whole of the substrate 120.

A buffer layer 128 is disposed on a whole of the lower hydrogen blocking layer 126 and the substrate 120.

For example, the buffer layer 128 may include a first layer of silicon nitride ($SiN_x$) and a second layer of silicon oxide ($SiO_x$) on the first layer.

A semiconductor layer 130 is disposed on the buffer layer 128 corresponding to the light shielding layer 122.

For example, the semiconductor layer 130 may include an oxide semiconductor material such as indium gallium zinc oxide (IGZO).

Although not shown, both end portions of the semiconductor layer 130 may have a conductive property to function as source and drain regions, respectively, and a central portion of the semiconductor layer 130 may function as a channel region CH. The both end portions of the semiconductor layer 130 are exposed through first and second contact holes C1 and C2, respectively, in an interlayer insulating layer 140. The central portion of the semiconductor layer 130 overlaps a gate electrode 138 and is covered with a gate insulating layer 132 and the interlayer insulating layer 140.

A gate insulating layer 132, a first upper hydrogen blocking layer 134, a first upper hydrogen capturing layer 136 and a gate electrode 138 are sequentially disposed on the central portion of the semiconductor layer 130. The gate insulating layer 132, the first upper hydrogen blocking layer 134, the first upper hydrogen capturing layer 136 and the gate electrode 138 may be formed through a single photolithographic process to have the same shape as each other.

Although not shown, a gate line and a sensing line may be disposed along a first direction (a horizontal direction) on the gate insulating layer 132 in the circuit area CA.

For example, the gate insulating layer may include an inorganic insulating material such as silicon oxide ($SiO_x$) and silicon nitride ($SiN_x$).

The first upper hydrogen blocking layer 134 blocks a hydrogen diffused from the first upper hydrogen capturing layer 136 to the first upper hydrogen blocking layer 134 to prevent diffusion of a hydrogen into the semiconductor layer 130.

When an amount of a hydrogen in the first upper hydrogen capturing layer 136 exceeds a saturation degree, a hydrogen of the first upper hydrogen capturing layer 136 may be diffused into the first upper hydrogen blocking layer 134. The first upper hydrogen blocking layer 134 may block an excess hydrogen of the first upper hydrogen capturing layer 136 to prevent diffusion of a hydrogen into the semiconductor layer 130.

The first upper hydrogen blocking layer 134 may have a greater hydrogen formation energy than a peripheral insulating layer. For example, the first upper hydrogen blocking layer 134 may have a hydrogen formation energy greater than about 1.0 eV. The first upper hydrogen blocking layer 134 may include a hydrogen blocking material having a hydrogen formation energy greater than about 3.5 eV which is a hydrogen formation energy of silicon oxide ($SiO_2$).

For example, the first upper hydrogen blocking layer 134 may include one of copper oxide ($CuO_x$), nickel oxide ($NiO_x$), iron oxide ($FeO_x$), cobalt oxide ($CoO_x$), manganese oxide ($MnO_x$), indium oxide ($InO_x$), tin oxide ($SnO_x$), zinc oxide ($ZnO_x$), silver oxide ($AgO_x$), gallium oxide ($GaO_x$) and tungsten oxide ($WO_x$). The first upper hydrogen blocking layer 134 may include one of aluminum oxide ($AlO_x$), magnesium oxide ($MgO_x$) and calcium oxide ($CaO_x$).

The first upper hydrogen capturing layer 136 captures a hydrogen diffused from the gate electrode 138 to the first upper hydrogen capturing layer 136 to prevent diffusion of a hydrogen into the semiconductor layer 130. The first upper hydrogen capturing layer 136 includes a hydrogen capturing material having a negative (−) hydrogen formation energy.

Since the hydrogen injected into the hydrogen capturing material having a negative (−) hydrogen formation energy is maintained as a stable state, the hydrogen capturing material may capture a peripheral hydrogen capable of diffusing into the semiconductor layer 130 to suppress a hydrogen diffusion.

For example, the first upper hydrogen capturing layer 136 may include one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

Although the gate insulating layer 132, the first upper hydrogen blocking layer 134, the first upper hydrogen capturing layer 136 and the gate electrode 138 are formed through a single photolithographic process in the first embodiment, the gate insulating layer 132 may be formed through a photolithographic process different from the first upper hydrogen blocking layer 134, the first upper hydrogen capturing layer 136 and the gate electrode 138 to have a shape different from the first upper hydrogen blocking layer 134, the first upper hydrogen capturing layer 136 and the gate electrode 138 in another embodiment.

For example, the gate electrode 138 may include a metallic material such as aluminum (Al) and copper (Cu).

An interlayer insulating layer 140 and a second upper hydrogen blocking layer 142 are sequentially disposed on a whole of the gate electrode 138 and the substrate 120.

The second upper hydrogen blocking layer 142 and the interlayer insulating layer 140 may have first and second contact holes C1 and C2 exposing the both end portions of the semiconductor layer 130, and the second upper hydrogen blocking layer 142, the interlayer insulating layer 140, the buffer layer 128 and the lower hydrogen blocking layer 126 may have a third contact hole C3 exposing an end portion of the lower hydrogen capturing layer 124.

For example, the interlayer insulating layer 140 may include an inorganic insulating material such as silicon oxide ($SiO_x$) and silicon nitride ($SiN_x$).

The second upper hydrogen blocking layer 142 blocks a hydrogen diffused from the second upper hydrogen capturing layer 144 to the second upper hydrogen blocking layer 142 and a hydrogen diffused to the second upper hydrogen blocking layer 142 through a passivation layer 150 to prevent diffusion of a hydrogen into the semiconductor layer 130.

When an amount of a hydrogen in the second upper hydrogen capturing layer 144 exceeds a saturation degree, a hydrogen of the second upper hydrogen capturing layer 144 may be diffused into the second upper hydrogen blocking layer 142. The second upper hydrogen blocking layer 142 may block an excess hydrogen of the second upper hydrogen capturing layer 144 to prevent diffusion of a hydrogen into the semiconductor layer 130.

The second upper hydrogen blocking layer 142 may have a greater hydrogen formation energy than a peripheral insulating layer. For example, the second upper hydrogen blocking layer 142 may have a hydrogen formation energy greater than about 1.0 eV. The second upper hydrogen blocking layer 142 may include a hydrogen blocking material having a hydrogen formation energy greater than about 3.5 eV which is a hydrogen formation energy of silicon oxide ($SiO_2$).

For example, the second upper hydrogen blocking layer 142 may include one of copper oxide ($CuO_x$), nickel oxide ($NiO_x$), iron oxide ($FeO_x$), cobalt oxide ($CoO_x$), manganese oxide ($MnO_x$), indium oxide ($InO_x$), tin oxide ($SnO_x$), zinc oxide ($ZnO_x$), silver oxide ($AgO_x$), gallium oxide ($GaO_x$) and tungsten oxide ($WO_x$). The second upper hydrogen blocking layer 142 may include one of aluminum oxide ($AlO_x$), magnesium oxide ($MgO_x$) and calcium oxide ($CaO_x$).

Although the first, second and third contact holes C1, C2 and C3 are formed in the second upper hydrogen blocking layer 142, the interlayer insulating layer 140, the buffer layer 128 and the lower hydrogen blocking layer 126 through a single photolithographic process in the first embodiment, the first, second and third contact holes C1, C2 and C3 of the second upper hydrogen blocking layer 142, the first, second and third contact holes C1, C2 and C3 of the interlayer insulating layer 140 and the buffer layer 128 and the first, second and third contact holes C1, C2 and C3 of the lower hydrogen blocking layer 126 may be formed through a photolithographic process different from each other to have a shape different from each other in another embodiment.

A second upper hydrogen capturing layer 144 and a source electrode 146 are sequentially disposed on the second upper hydrogen blocking layer 142 corresponding to one end portion of the semiconductor layer 130, and the second upper hydrogen capturing layer 144 and a drain electrode 148 are sequentially disposed on the second upper hydrogen blocking layer 142 corresponding to the other end portion of the semiconductor layer 130. The second upper hydrogen capturing layer 144 and the source electrode 146 may be formed through a single photolithographic process to have the same shape as each other, and the second upper hydrogen capturing layer 144 and the drain electrode 148 may be formed through a single photolithographic process to have the same shape as each other.

Although not shown, a data line, a power line and a reference line may be disposed along a second direction (a vertical direction) crossing the first direction on the second upper hydrogen blocking layer 142 in the circuit area CA.

Although the second upper hydrogen capturing layer 144, the source electrode 146 and the drain electrode 148 do not cover and exposes the gate electrode 138 and the semiconductor layer 130 in the first embodiment, the second upper hydrogen capturing layer 144, the source electrode 146 and the drain electrode 148 may cover the gate electrode 138 and the semiconductor layer 130 in another embodiment.

The second hydrogen capturing layer 144 captures a hydrogen diffused from the source electrode 146 and the drain electrode 148 to the second upper hydrogen capturing layer 144 to prevent diffusion of a hydrogen into the semiconductor layer 130. The second upper hydrogen capturing layer 144 includes a hydrogen capturing material having a negative (−) hydrogen formation energy.

Since the hydrogen injected into the hydrogen capturing material having a negative (−) hydrogen formation energy is maintained as a stable state, the hydrogen capturing material may capture a peripheral hydrogen capable of diffusing into the semiconductor layer 130 to suppress a hydrogen diffusion.

For example, the second upper hydrogen capturing layer 144 may include one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

The source electrode 146 and the second upper hydrogen capturing layer 144 may be connected to one end portion of the semiconductor layer 130 through the first contact hole C1 of the second upper hydrogen blocking layer 142 and the interlayer insulating layer 140 and may be connected to one end portion of the lower hydrogen capturing layer 124 and the light shielding layer 122 through the third contact hole C3 of the second upper hydrogen blocking layer 142, the interlayer insulating layer 140, the buffer layer 128 and the lower hydrogen blocking layer 126. The drain electrode 148 and the second upper hydrogen capturing layer 144 may be connected to the other end portion of the semiconductor layer 130 through the second contact hole C2 of the second upper hydrogen blocking layer 142 and the interlayer insulating layer 140.

For example, the source electrode 146 and the drain electrode 148 may include a metallic material such as aluminum (Al), molybdenum titanium (MoTi) and copper (Cu).

The semiconductor layer 130, the gate electrode 138, the source electrode 146 and the drain electrode 148 constitute a driving thin film transistor (TFT) Tdr.

Although not shown, the switching TFT and the sensing TFT may have the same structure as the driving TFT Tdr, and at least one of the switching TFT, the driving TFT Tdr and the sensing TFT may include the lower hydrogen capturing layer 124, the lower hydrogen blocking layer 126, the first upper hydrogen capturing layer 136, the first upper hydrogen blocking layer 134, the second upper hydrogen capturing layer 144 and the second hydrogen blocking layer 142.

A passivation layer 150 is disposed on a whole of the source electrode 146, the drain electrode 148 and the substrate 120.

For example, the passivation layer 150 may include an inorganic insulating material such as silicon oxide ($SiO_x$) and silicon nitride ($SiN_x$) or an organic insulating material such as photoacryl.

A third upper hydrogen blocking layer 152 is disposed on a whole of the passivation layer 150 and the substrate 120.

The third upper hydrogen blocking layer 152 blocks a hydrogen diffused from the third upper hydrogen capturing layer 156 to the third upper hydrogen blocking layer 152 and a hydrogen diffused from an organic material layer or an inorganic material layer such as a bank layer 160 on a planarizing layer 154 to the third upper hydrogen blocking layer 152 through the planarizing layer 154 to prevent diffusion of a hydrogen into the semiconductor layer 130.

When an amount of a hydrogen in the third upper hydrogen capturing layer 156 exceeds a saturation degree, a hydrogen of the third upper hydrogen capturing layer 156 may be diffused into the third upper hydrogen blocking layer 152. The third upper hydrogen blocking layer 152 may block an excess hydrogen of the third upper hydrogen capturing layer 156 to prevent diffusion of a hydrogen into the semiconductor layer 130.

The third upper hydrogen blocking layer 152 may have a greater hydrogen formation energy than a peripheral insulating layer. For example, the third upper hydrogen blocking layer 152 may have a hydrogen formation energy greater than about 1.0 eV. The third upper hydrogen blocking layer 152 may include a hydrogen blocking material having a hydrogen formation energy greater than about 3.5 eV which is a hydrogen formation energy of silicon oxide ($SiO_2$).

For example, the third upper hydrogen blocking layer 152 may include one of copper oxide ($CuO_x$), nickel oxide ($NiO_x$), iron oxide ($FeO_x$), cobalt oxide ($CoO_x$), manganese oxide ($MnO_x$), indium oxide ($InO_x$), tin oxide ($SnO_x$), zinc oxide ($ZnO_x$), silver oxide ($AgO_x$), gallium oxide ($GaO_x$) and tungsten oxide ($WO_x$). The lower hydrogen blocking layer 126 may include one of aluminum oxide ($AlO_x$), magnesium oxide ($MgO_x$) and calcium oxide ($CaO_x$).

A planarizing layer 154 is disposed on a whole of the third upper hydrogen blocking layer 152 and the substrate 120.

The planarizing layer 154 planarizes a surface of the substrate 120 having the driving TFT Tdr.

For example, the planarizing layer 154 may include an organic insulating material such as photoacryl.

The planarizing layer 154, the third upper hydrogen blocking layer 152 and the passivation layer 150 have a fourth contact hole C4 exposing the source electrode 146.

Although the fourth contact hole C4 is formed in the planarizing layer 154, the third upper hydrogen blocking layer 152 and the passivation layer 150 through a single photolithographic process in the first embodiment, the fourth contact hole C4 of the planarizing layer 154, the fourth contact hole C4 of the third upper hydrogen blocking layer 152 and the fourth contact hole C4 of the passivation layer 150 may be formed through a photolithographic process different from each other to have a shape different from each other in another embodiment.

A third upper hydrogen capturing layer 156 and a first electrode 158 are sequentially disposed on the planarizing layer 154 in the emission area EA and the circuit area CA of each of the plurality of subpixels SP. The third upper hydrogen capturing layer 156 and the first electrode 158 may be formed through a single photolithographic process to have the same shape as each other.

The third upper hydrogen capturing layer 156 captures a hydrogen diffused from the first electrode 158 to the third upper hydrogen capturing layer 156 to prevent diffusion of a hydrogen into the semiconductor layer 130. The third upper hydrogen capturing layer 156 includes a hydrogen capturing material having a negative (−) hydrogen formation energy.

Since the hydrogen injected into the hydrogen capturing material having a negative (−) hydrogen formation energy is maintained as a stable state, the hydrogen capturing material may capture a peripheral hydrogen capable of diffusing into the semiconductor layer 130 to suppress a hydrogen diffusion.

For example, the third upper hydrogen capturing layer 156 may include one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

The first electrode 158 may be an anode supplying a hole to a light emitting layer 162 or a cathode supplying an electron to the light emitting layer 162.

The first electrode 158 and the third upper hydrogen capturing layer 156 are connected to the source electrode 146 through the fourth contact hole C4.

Although the third upper hydrogen capturing layer 156 and the first electrode 158 do not cover and expose the gate electrode 138 and the semiconductor layer 130 in the first embodiment, the third upper hydrogen capturing layer 156 and the first electrode 158 may cover the gate electrode 138 and the semiconductor layer 130 in another embodiment.

A bank layer 160 is disposed on the first electrode 158 and has an open portion exposing the first electrode 158 corresponding to the emission area EA of each of the plurality of subpixels SP.

A light emitting layer 162 is disposed on the first electrode 158 exposed through the open portion of the bank layer 160.

The light emitting layer 162 may include a hole injecting layer (HIL), a hole transporting layer (HTL), an emitting material layer (EML), an electron transporting layer (ETL) and an electron injecting layer (EIL).

A second electrode 164 is disposed on a whole of the light emitting layer 162 and the substrate 120.

The second electrode 164 may be a cathode supplying an electron to the light emitting layer 162 or an anode supplying a hole to the light emitting layer 162.

For example, when the display device 110 is a top emission type organic light emitting diode (OLED) display device, a reflective electrode (not shown) or a reflective plate (not shown) including a material of a relatively high reflectance such as aluminum palladium copper (APC) may be disposed under the first electrode 156. In addition, the first electrode 158 may include indium tin oxide (ITO) or indium zinc oxide (IZO) having a relatively high work function, and the second electrode 164 may include magnesium silver (MgAg) having a relatively low work function. Alternatively, the second electrode 164 may include a transparent electrode of a transparent conductive oxide (TCO) such as indium tin oxide (ITO) and indium zinc oxide (IZO).

When the display device 110 is a bottom emission type OLED display device, the first electrode 158 may include indium tin oxide (ITO) or indium zinc oxide (IZO) having a relatively high work function, and the second electrode 164 may include aluminum (Al) or calcium (Ca) having a relatively low work function.

The first electrode 158, the light emitting layer 162 and the second electrode 164 constitute a light emitting diode Del.

Although not shown, when the display device 110 is a top emission type OLED display device, an encapsulating layer having a plurality of organic layers and a plurality of inorganic layers, a color filter layer and a polarizing layer may be sequentially disposed on the light emitting diode Del. When the display device 110 is a bottom emission type OLED display device, an encapsulating substrate of a metal may be disposed on the light emitting diode Del, a color filter layer may be disposed under the light emitting diode Del between the planarizing layer 154 and the third upper hydrogen blocking layer 152, between the third upper hydrogen blocking layer 152 and the passivation layer 150, between the passivation layer 150 and the second upper hydrogen blocking layer 142 or between the second upper hydrogen blocking layer 142 and the interlayer insulating layer 140, and a polarizing layer may be disposed under the substrate 120.

In the display device 110, the first upper hydrogen capturing layer 136 is disposed between the gate electrode 138 and the semiconductor layer 130, and the second upper hydrogen capturing layer 144 is disposed between the source and drain electrodes 146 and 148 and the semiconductor layer 130. The third upper hydrogen capturing layer 156 is disposed between the first electrode 158 and the semiconductor layer 130, and the lower hydrogen capturing layer 124 is disposed between the light shielding layer 122 and the semiconductor layer 130. Since the first, second, and third upper hydrogen capturing layers 136, 144, and 156 and the lower hydrogen capturing layer 124 capture an external hydrogen or an internal hydrogen of the organic layer or the inorganic layer, a hydrogen diffusion is minimized or reduced to prevent deterioration of the semiconductor layer 130. As a result, deterioration of an electric property of the driving TFT Tdr and deterioration of a reliability of the display device 110 are prevented.

Further, the first upper hydrogen blocking layer 134 is disposed between the first upper hydrogen capturing layer 136 and the semiconductor layer 130, and the second upper hydrogen blocking layer 142 is disposed between the second upper hydrogen capturing layer 144 and the semiconductor layer 130. The third upper hydrogen blocking layer 152 is disposed between the third upper hydrogen capturing layer 156 and the semiconductor layer 130, and the lower hydrogen blocking layer 126 is disposed between the lower hydrogen capturing layer 124 and the semiconductor layer 130. Since the first, second, and third upper hydrogen blocking layers 134, 142, and 126 and the lower hydrogen blocking layer 126 block an excess hydrogen of the first, second and third upper hydrogen capturing layers 136, 144 and 156 and the lower hydrogen capturing layer 124, a hydrogen diffusion is reduced or minimized to prevent deterioration of the semiconductor layer 130. As a result, deterioration of an electric property of the driving TFT Tdr and deterioration of a reliability of the display device 110 are prevented.

Properties of a hydrogen capturing material and a hydrogen blocking material will be illustrated with reference to drawings.

Figure 2A:
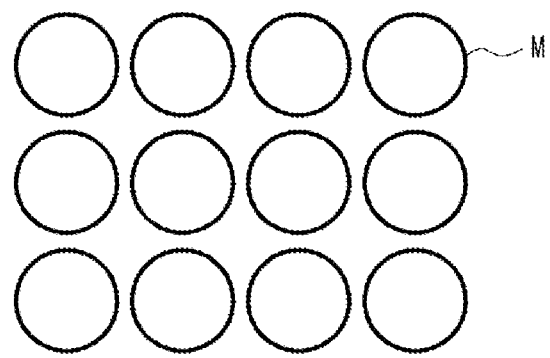
FIGS. 2A, 2B, and 2C are views showing a hydrogen formation energy of a display device according to a first embodiment of the present disclosure.
Figure 2B:
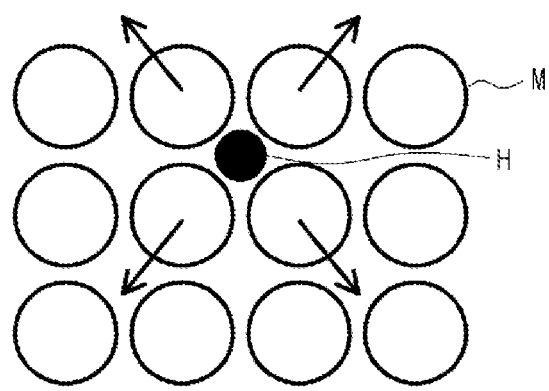
Figure 2C:
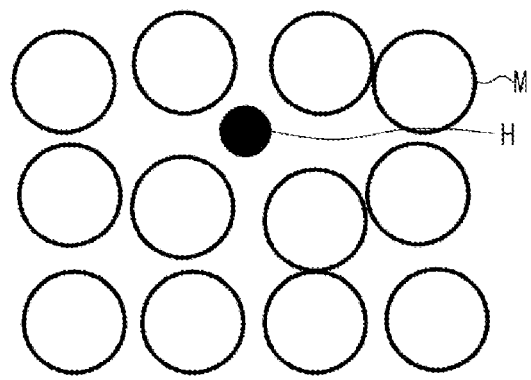

FIGS. 2A, 2B and 2C are views showing a hydrogen formation energy of a display device according to a first embodiment of the present disclosure. FIGS. 2A, 2B and 2C correspond to a first stable state before hydrogen injection, an intermediate sate right after hydrogen injection and a second stable state after a hydrogen injection, respectively.

In FIGS. 2A, 2B and 2C, before a hydrogen H is injected into an object material, atoms M are regularly arranged at a lattice site such that the object material has a first stable state. Right after a hydrogen H is injected into the object material, the adjacent atoms M stray from the lattice site due to the hydrogen H such that the object material has an intermediate state. Next, the hydrogen H and the adjacent atoms M are rearranged at a new site such that the object material has a second stable state.

The object material of the first stable state before hydrogen injection has a first energy E1 (M without H), and the object material of the second stable state after hydrogen injection has a second energy E2 (M with H) different from the first energy E1 (M without H).

A hydrogen formation energy ($\Delta E(H_i)$) of the object material may calculated from a following equation using the first and second energies E1 and E2 and a third energy E3($H_2$) of a hydrogen.

$$\Delta E(H_i)=E2(M \text{ with } H)-E1(M \text{ without } H)-E3(H_2)/2$$

Here, a positive (+) hydrogen formation energy ($\Delta E(H_i)$) may correspond to a case where an energy of the object material increases due to the injected hydrogen H and the state becomes more unstable, and a negative (−) hydrogen formation energy ($\Delta E(H_i)$) may correspond to a case where an energy of the object material decreases due to the injected hydrogen H and the state becomes more stable.

A behavior of a hydrogen in the object material may not be grasped by a macro analysis using a measuring apparatus and may be grasped by a micro analysis.

For example, a behavior of a hydrogen may be grasped through a first principle's calculation (ab initio) where a direct atom behavior is verified. The first principle's calculation is a method where an electro structural property of a material is found out using a theoretical calculation based on a quantum mechanics of a Schrödinger equation without an experimental result.

In the first principle's calculation, an energy and an electric property of the object material may be analyzed and a hydrogen formation energy ($\Delta E(H_i)$) may be calculated using a density functional theory (DFT) without directly solving a Schrödinger equation due to a limitation of a computation quantity.

A hydrogen capture property of an object material may be grasped using a hydrogen formation energy ($\Delta E(H_i)$) calculated through a first principle's calculation.

Figure 3:
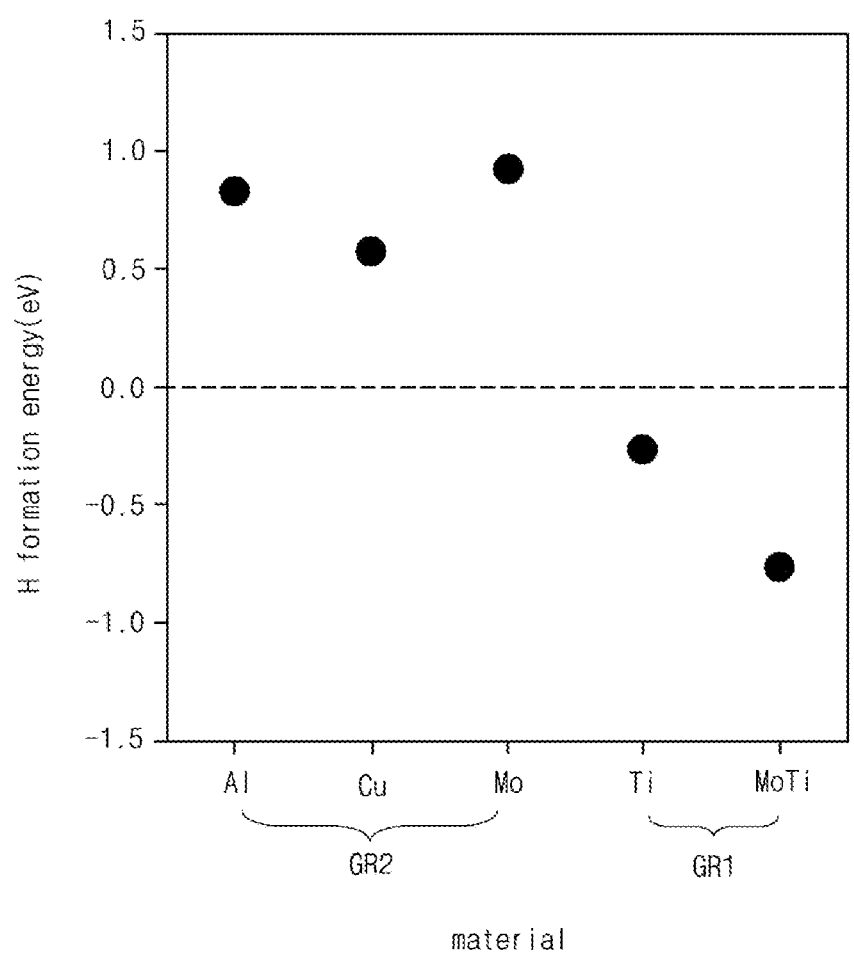
FIG. 3 is a graph showing a hydrogen formation energy of a material of first and second groups of a display device according to a first embodiment of the present disclosure.
Figure 4A:
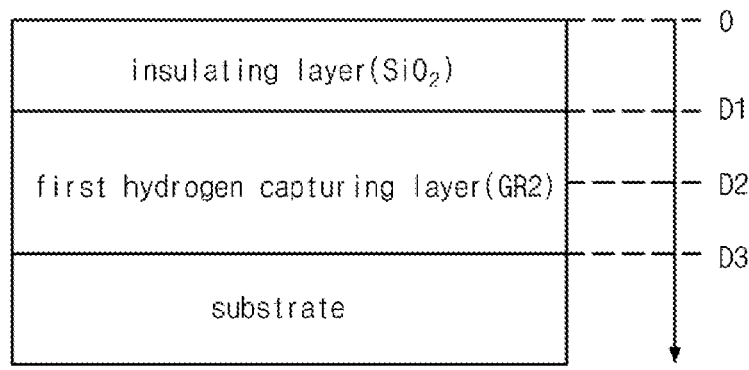
FIGS. 4A and 4B are cross-sectional views showing first and second samples, respectively, of a material of first and second groups of a display device according to a first embodiment of the present disclosure.
Figure 4B:
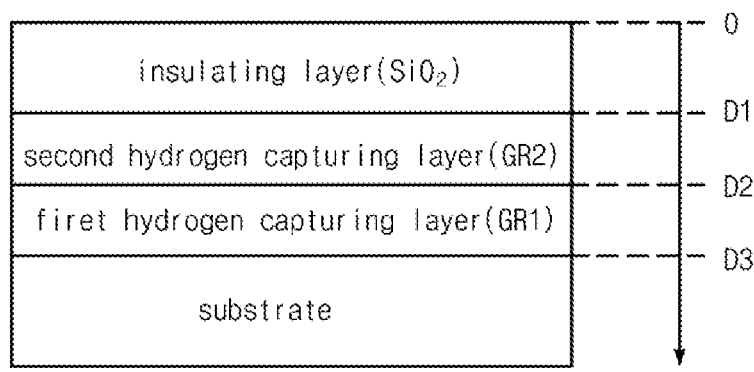
Figure 5:
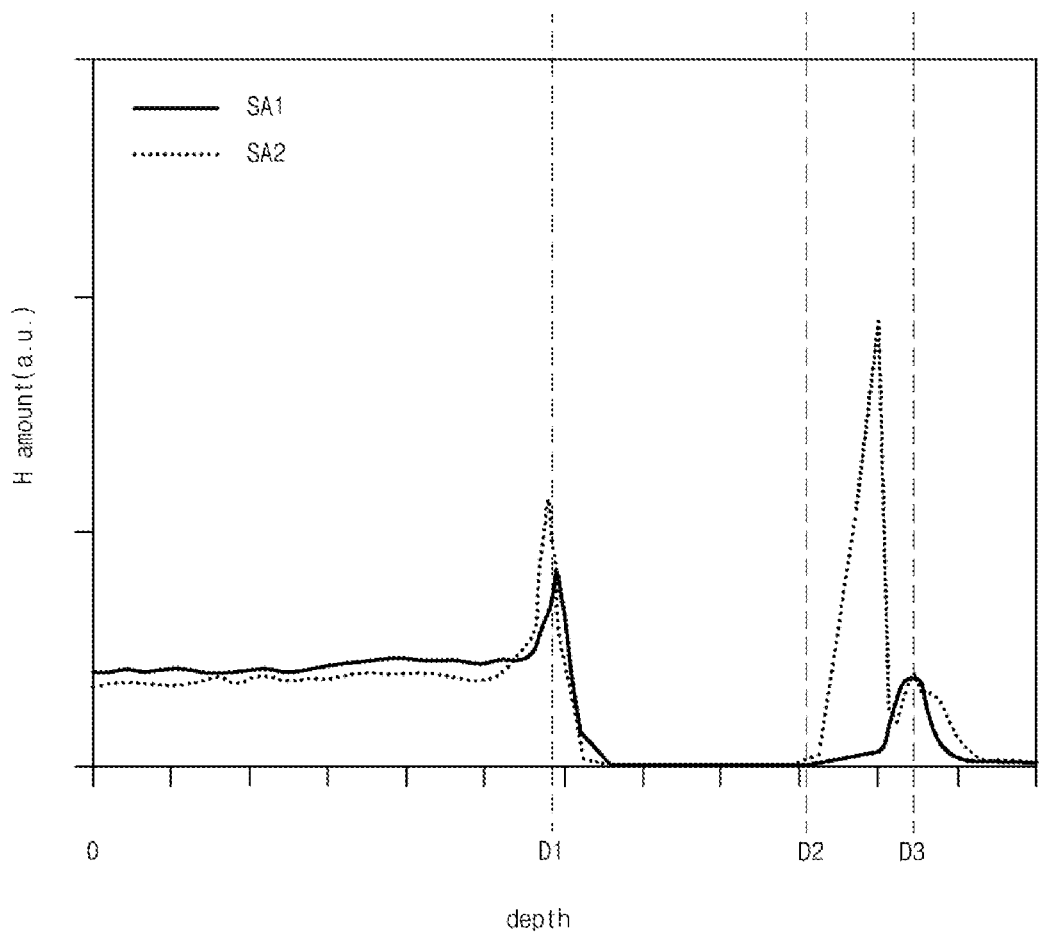
FIG. 5 is a graph showing a hydrogen content of first and second samples of FIGS. 4A and 4B.

FIG. 3 is a graph showing a hydrogen formation energy of a material of first and second groups of a display device according to a first embodiment of the present disclosure, FIGS. 4A and 4B are cross-sectional views showing first and second samples, respectively, of a material of first and second groups of a display device according to a first embodiment of the present disclosure, FIG. 5 is a graph showing a hydrogen content of first and second samples of FIGS. 4A and 4B, and FIGS. 6A and 6B are graphs showing a threshold voltage shift of a thin film transistor including second and first samples, respectively, of a display device according to a first embodiment of the present disclosure.

In FIG. 3, titanium (Ti) and molybdenum titanium (MoTi) have a negative (−) hydrogen formation energy ($\Delta E(H_i)$), while aluminum (Al), copper (Cu) and molybdenum (Mo) have a relatively low positive (+) hydrogen formation energy ($\Delta E(H_i)$) (e.g., about 0 eV~about 1.0 eV).

Vanadium (V), niobium (Nb), tantalum (Ta), hafnium (Hf), zirconium (Zr), cerium (Ce), lanthanum (La), yttrium (Y), scandium (Sc) and lithium (Li) also have a negative (−) hydrogen formation energy ($\Delta E(H_i)$).

In a material of a first group GR1 having a negative (−) hydrogen formation energy ($\Delta E(H_i)$), since an energy of an object material decreases due to an injected hydrogen (H), a state is further stabilized. As a result, the material of the first group GR1 may be used for a hydrogen capturing layer capturing a hydrogen (H) to minimize or reduced diffusion of a hydrogen (H).

Chromium (Cr), tungsten (W), nickel (Ni), platinum (Pt), silver (Ag), gold (Au), palladium (Pd), iridium (Ir), rhodium (Rh), cobalt (Co), ruthenium (Rh), iron (Fe) and magnesium (Mg) also have a relatively low positive (+) hydrogen formation energy ($\Delta E(H_i)$).

In a material of a second group GR2 having a relatively low positive (+) hydrogen formation energy ($\Delta E(H_i)$) (e.g., lower than about 1.0 eV), since an energy of an object material increases due to an injected hydrogen (H), a state is further destabilized. As a result, the material of the second group GR2 may hardly be used for a hydrogen capturing layer capturing a hydrogen (H).

A material of third and fourth groups GR3 and GR4 having a relatively high positive (+) hydrogen formation energy ($\Delta E(H_i)$) (e.g., higher than about 1.0 eV) may be used for a hydrogen blocking layer.

In FIG. 4A, a first sample SA1 includes a first hydrogen capturing layer of a material of a second group GR2 and an insulating layer of silicon oxide ($SiO_2$) sequentially disposed on a substrate. An interface between the insulating layer and the first hydrogen capturing layer is disposed at a first depth D1 from a top surface of the insulating layer, and an interface between the first hydrogen capturing layer and the substrate is disposed at a third depth D3 from the top surface of the insulating layer.

In FIG. 4B, a second sample SA2 includes a first hydrogen capturing layer of a material of a first group GR1, a second hydrogen capturing layer of a material of a second group GR2 and an insulating layer of silicon oxide ($SiO_2$) sequentially disposed on a substrate. An interface between the insulating layer and the second hydrogen capturing layer is disposed at a first depth D1 from a top surface of the insulating layer, an interface between the second hydrogen capturing layer and the first hydrogen capturing layer is disposed at a second depth D2 from the top surface of the insulating layer, and an interface between the first hydrogen capturing layer and the substrate is disposed at a third depth D3 from the top surface of the insulating layer.

In the first sample SA1 of FIG. 5, a hydrogen amount is a uniform value greater than 0 in the insulating layer, increases at the first depth D1 of the interface between the insulating layer and the first hydrogen capturing layer, is nearly 0 in the first hydrogen capturing layer of the material of the second group GR2, increases at the third depth D3 of the interface between the first hydrogen capturing layer and the substrate, and is nearly 0 in the substrate.

In the first sample SA1, the first hydrogen capturing layer of the material of the second group GR2 does not capture a hydrogen diffused from the insulating layer. As a result, the material of the second group GR2 having a relatively low positive (+) hydrogen formation energy ($\Delta E(H_i)$) may hardly be used for a hydrogen capturing layer capturing an injected hydrogen (H).

In the second sample SA2 of FIG. 5, a hydrogen amount is a uniform value greater than 0 in the insulating layer, increases at the first depth D1 of the interface between the insulating layer and the second hydrogen capturing layer, is nearly 0 in the first hydrogen capturing layer of the material of the second group GR2, is nearly 0 at the second depth D2 of the interface between the second hydrogen capturing layer and the first hydrogen capturing layer, drastically increases in the first hydrogen capturing layer, increases at the third depth D3 of the interface between the first hydrogen capturing layer and the substrate, and is nearly 0 in the substrate.

In the second sample SA2, while the second hydrogen capturing layer of the material of the second group GR2 does not capture a hydrogen diffused from the insulating layer, the first hydrogen capturing layer of the material of the first group GR1 captures a hydrogen diffused from the insulating layer. As a result, although the material of the second group GR2 having a relatively low positive (+) hydrogen formation energy ($\Delta E(H_i)$) may hardly be used for a hydrogen capturing layer capturing an injected hydrogen (H), the material of the first group GR1 having a negative (−) hydrogen formation energy ($\Delta E(H_i)$) may be used for a hydrogen capturing layer capturing an injected hydrogen (H).

Figure 6A:
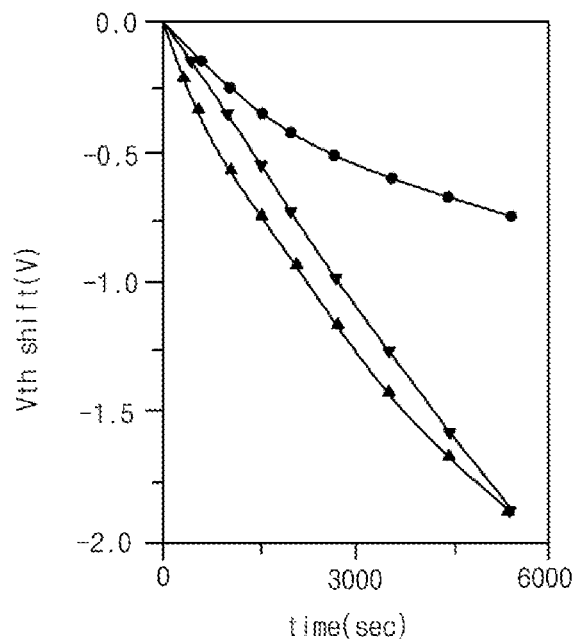
FIGS. 6A and 6B are graphs showing a threshold voltage shift of a thin film transistor including second and first samples, respectively, of a display device according to a first embodiment of the present disclosure.

In FIG. 6A, when a hydrogen capturing layer of the material of the second group GR2 is formed under a metal layer of a thin film transistor, a threshold voltage Vth of the thin film transistor is relatively greatly shifted according to a time.

For example, about 5500 seconds later, the threshold voltage of the thin film transistor may decrease by about −1.8V.

Figure 6B:
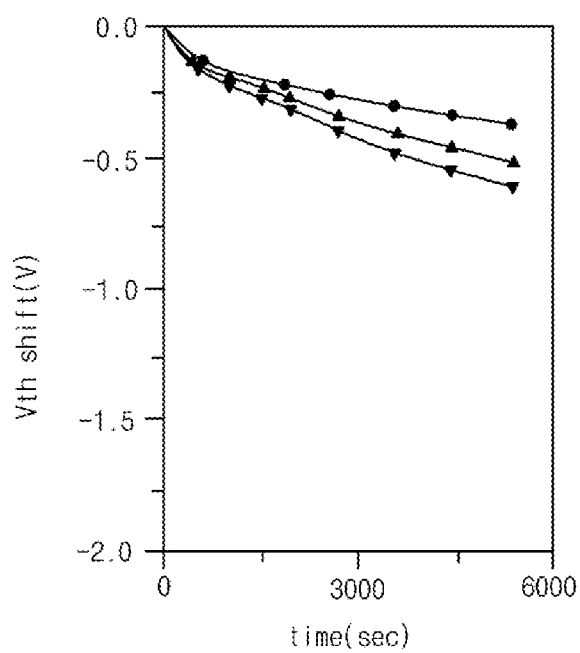

In FIG. 6B, when a hydrogen capturing layer of the material of the first group GR1 is formed under a metal layer of a thin film transistor, a threshold voltage Vth of the thin film transistor is relatively exiguously shifted according to a time.

For example, about 5500 seconds later, the threshold voltage of the thin film transistor may decrease by about −0.5V.

The material of the first group GR1 having a negative (−) hydrogen formation energy ($\Delta E(H_i)$) may include one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

The material of the second group GR2 having a relatively low positive (+) hydrogen formation energy ($\Delta E(H_i)$) (e.g., lower than about 1.0 eV) may include one of chromium (Cr), molybdenum (Mo), tungsten (W), nickel (Ni), platinum (Pt), copper (Cu), silver (Ag), gold (Au), aluminum (Al), palladium (Pd), iridium (Jr), rhodium (Rh), cobalt (Co), ruthenium (Rh), iron (Fe) and magnesium (Mg).

In the display device 110 according to a first embodiment of the present disclosure, since the first, second and third upper hydrogen capturing layers 136, 144 and 156 and the lower hydrogen capturing layer 124 are formed of a hydrogen capturing material of the first group GR1 having a negative (−) hydrogen formation energy ($\Delta E(H_i)$), an external hydrogen or an internal hydrogen of an organic layer and an inorganic layer is captured to reduce or minimize a hydrogen diffusion and to prevent deterioration of the semiconductor layer 130. As a result, deterioration of an electric property of the driving TFT Tdr and deterioration of a reliability of the display device 110 are prevented.

A blocking property of an object material against a hydrogen may be grasped using a deviation of a hydrogen formation energy ($\Delta E(H_i)$) according to a position of a hydrogen (H) in the object material.

Figure 7:
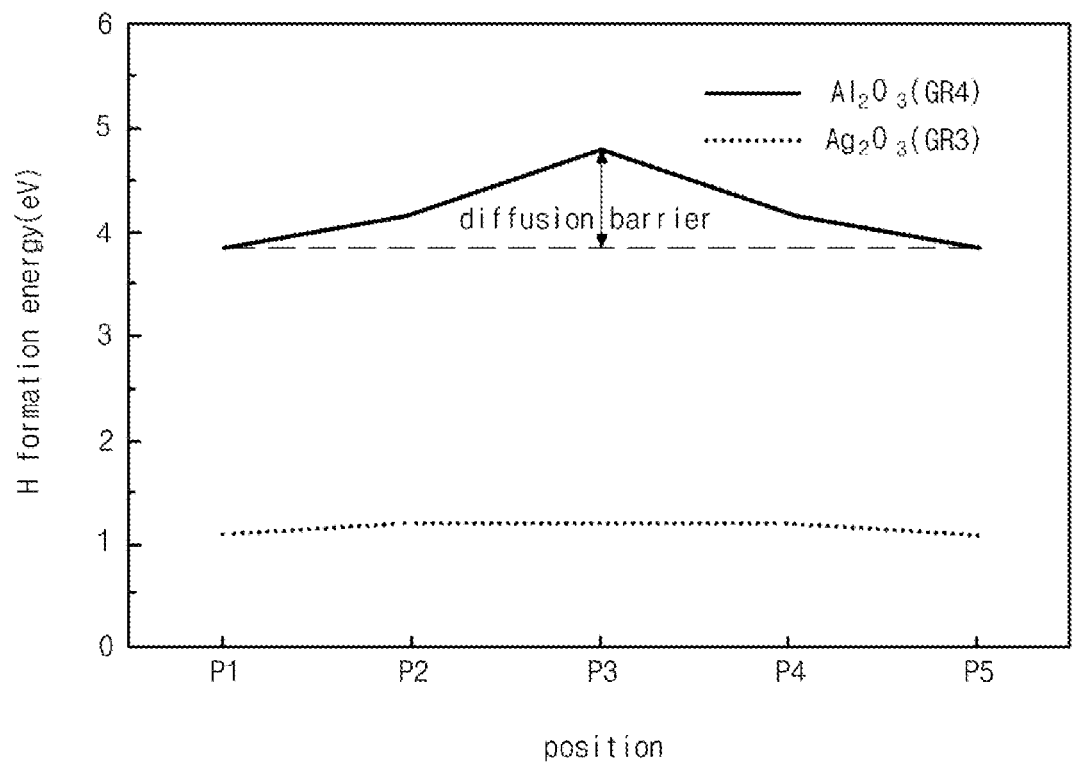
FIG. 7 is a graph showing a variation of a hydrogen formation energy with respect to a position of a hydrogen in an object material of third and fourth groups of a display device according to a first embodiment of the present disclosure.

FIG. 7 is a graph showing a variation of a hydrogen formation energy with respect to a position of a hydrogen in an object material of third and fourth groups of a display device according to a first embodiment of the present disclosure.

In FIG. 7, a material of third and fourth groups GR3 and GR4 has a relatively high positive (+) hydrogen formation energy ($\Delta E(H_i)$) (e.g., higher than about 1.0 eV).

In the material of the third group GR3, when an injected hydrogen (H) is located at first to fifth points P1 to P5, the hydrogen formation energy ($\Delta E(H_i)$) hardly varies.

As a result, in the material of the third group GR3, the injected hydrogen (H) relatively freely moves among the first to fifth points P1 to P5 and a diffusion barrier is not generated.

In the material of the fourth group GR4 having a greater hydrogen formation energy ($\Delta E(H_i)$) than the material of the third group GR3, the hydrogen formation energy ($\Delta E(H_i)$) has a minimum value when the injected hydrogen (H) is located at the first and fifth points P1 and P5, the hydrogen formation energy ($\Delta E(H_i)$) has an intermediate value when the injected hydrogen (H) is located at the second and fourth points P2 and P4, and the hydrogen formation energy ($\Delta E(H_i)$) has a maximum value when the injected hydrogen (H) is located at the third point P3.

As a result, in the material of the fourth group GR4, the third point P3 functions as a diffusion barrier between the first and fifth points P1 and P5 and the injected hydrogen (H) does not freely move between the first and fifth points P1 and P5.

Accordingly, a hydrogen blocking layer of the material of the fourth group GR4 may have a superior hydrogen blocking property to a hydrogen blocking layer of the material of the third group GR3.

Here, the material of the fourth group GR4 has a greater hydrogen formation energy ($\Delta E(H_i)$) than the material of the third group GR3.

For example, the material of the third group GR3 may have a hydrogen formation energy ($\Delta E(H_i)$) equal to or higher than about 1.0 eV and equal to or lower than about 3.5 eV which is a hydrogen formation energy of silicon oxide ($SiO_2$). The material of the fourth group GR4 may have a hydrogen formation energy ($\Delta E(H_i)$) higher than about 3.5 eV which is a hydrogen formation energy of silicon oxide ($SiO_2$).

The material of the third group GR3 may include one of copper oxide ($CuO_x$), nickel oxide ($NiO_x$), iron oxide ($FeO_x$), cobalt oxide ($CoO_x$), manganese oxide ($MnO_x$), indium oxide ($InO_x$), tin oxide ($SnO_x$), zinc oxide ($ZnO_x$), silver oxide ($AgO_x$), gallium oxide ($GaO_x$) and tungsten oxide ($WO_x$).

The material of the fourth group GR4 may include one of aluminum oxide ($AlO_x$), magnesium oxide ($MgO_x$) and calcium oxide ($CaO_x$).

In the display device 110 according to a first embodiment of the present disclosure, since the first, second, and third upper hydrogen blocking layers 134, 142, and 152 and the lower hydrogen blocking layer 126 are formed of a hydrogen blocking material of the third and fourth groups GR3 and GR4 having a relatively high positive (+) hydrogen formation energy ($\Delta E(H_i)$), diffusion of an excess hydrogen of the first, second, and third upper hydrogen capturing layers 136, 144, and 156 and the lower hydrogen capturing layer 124 is blocked to reduce or minimize a hydrogen diffusion and to prevent deterioration of the semiconductor layer 130. As a result, deterioration of an electric property of the driving TFT Tdr and deterioration of a reliability of the display device 110 are prevented.

Specifically, since the first, second and third upper hydrogen blocking layers 134, 142 and 152 and the lower hydrogen blocking layer 126 are formed of a hydrogen blocking material of the fourth group GR4 having a hydrogen formation energy ($\Delta E(H_f)$) higher than about 3.5 eV which is a hydrogen formation energy of silicon oxide ($SiO_2$), diffusion of an excess hydrogen of the first, second and third upper hydrogen capturing layers 136, 144 and 156 and the lower hydrogen capturing layer 124 is further effectively blocked.

In another embodiment, a gate insulating layer and a first upper hydrogen blocking layer may be disposed on a whole of a substrate.

Figure 8:
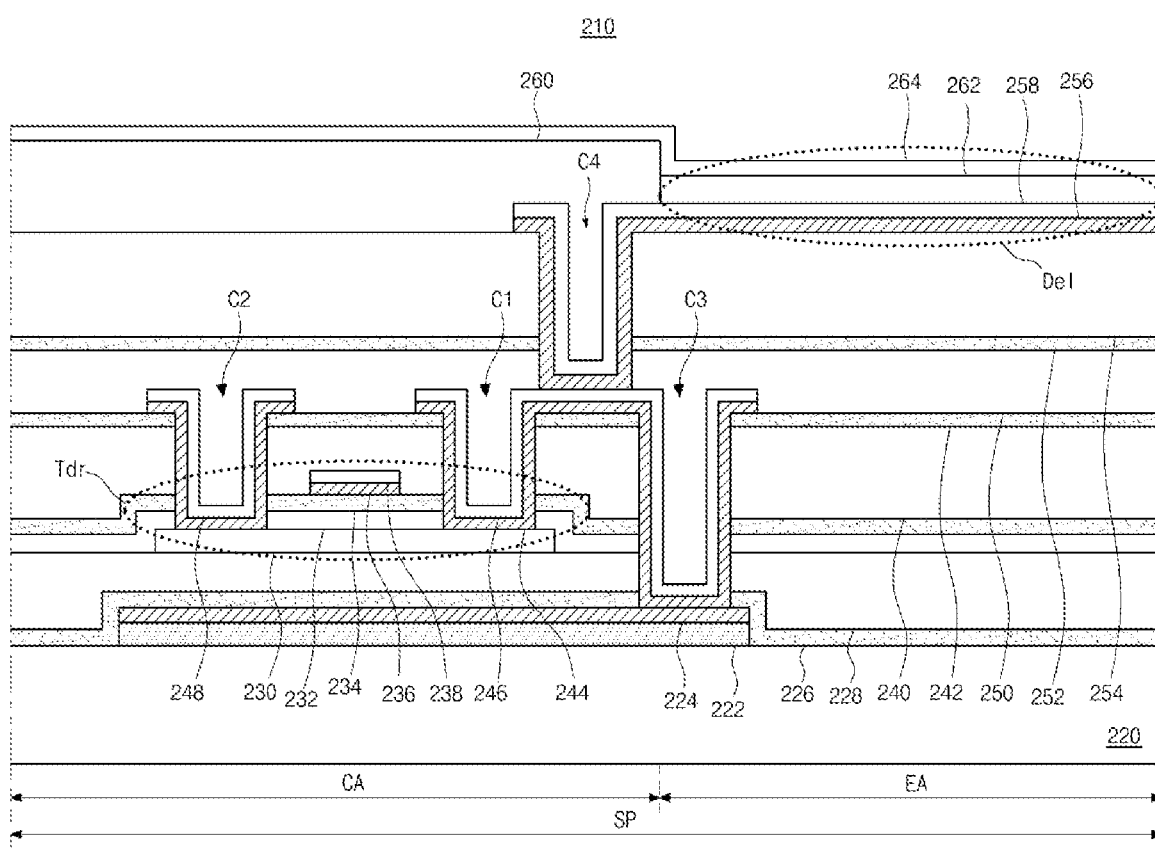
FIG. 8 is a cross-sectional view showing a subpixel of a display device according to a second embodiment of the present disclosure.

FIG. 8 is a cross-sectional view showing a subpixel of a display device according to a second embodiment of the present disclosure. Illustration on a part the same as the first embodiment will be omitted.

In FIG. 8, a display device 210 according to a second embodiment of the present disclosure includes a substrate 220, a switching thin film transistor (TFT) (not shown), a driving TFT Tdr, a sensing TFT (not shown), a storage capacitor (not shown) and a light emitting diode (Del).

The substrate 220 includes a plurality of pixels. Each of the plurality of pixels includes a plurality of subpixels SP, and each of the plurality of subpixels SP includes an emission area EA and a circuit area CA.

A light shielding layer 222 and a lower hydrogen capturing layer 224 are sequentially disposed in the circuit area CA of each of the plurality of subpixels SP on the substrate 220. The light shielding layer 222 and the lower hydrogen capturing layer 224 may be formed through a single photolithographic process to have the same shape as each other.

The light shielding layer 222 is disposed to overlap a semiconductor layer 230 of each of the switching TFT, the driving TFT Tdr and the sensing TFT.

The lower hydrogen capturing layer 224 captures a hydrogen (H) diffused from the light shielding layer 222 to the lower hydrogen capturing layer 224 to prevent diffusion of a hydrogen into the semiconductor layer 230. The lower hydrogen capturing layer 224 includes a hydrogen capturing material having a negative (−) hydrogen formation energy.

A lower hydrogen blocking layer 226 is disposed on a whole of the lower hydrogen capturing layer 224 and the substrate 220. The lower hydrogen blocking layer 226 blocks a hydrogen diffused from the lower hydrogen capturing layer 224 to the lower hydrogen blocking layer 226 and a hydrogen diffused from the substrate 220 or an inorganic material layer on the substrate 220 to the lower hydrogen blocking layer 226 to prevent diffusion of a hydrogen into the semiconductor layer 230.

The lower hydrogen blocking layer 226 may have a greater hydrogen formation energy than a peripheral insulating layer. For example, the lower hydrogen blocking layer 226 may have a hydrogen formation energy greater than about 1.0 eV. The lower hydrogen blocking layer 226 may include a hydrogen blocking material having a hydrogen formation energy greater than about 3.5 eV which is a hydrogen formation energy of silicon oxide ($SiO_2$).

A buffer layer 228 is disposed on a whole of the lower hydrogen blocking layer 226 and the substrate 220.

A semiconductor layer 230 is disposed on the buffer layer 228 corresponding to the light shielding layer 222.

For example, the semiconductor layer 230 may include an oxide semiconductor material such as indium gallium zinc oxide (IGZO).

A gate insulating layer 232 and a first upper hydrogen blocking layer 234 are sequentially disposed on a whole of the semiconductor layer 230 and the substrate 220.

The first upper hydrogen blocking layer 234 blocks a hydrogen diffused from a first upper hydrogen capturing layer 236 and a second upper hydrogen capturing layer 244 to the first upper hydrogen blocking layer 234 to prevent diffusion of a hydrogen into the semiconductor layer 230.

The first upper hydrogen blocking layer 234 may have a greater hydrogen formation energy than a peripheral insulating layer. For example, the first upper hydrogen blocking layer 234 may have a hydrogen formation energy greater than about 1.0 eV. The first upper hydrogen blocking layer 234 may include a hydrogen blocking material having a hydrogen formation energy greater than about 3.5 eV which is a hydrogen formation energy of silicon oxide ($SiO_2$).

A first upper hydrogen capturing layer 236 and a gate electrode 238 are sequentially disposed on the first upper hydrogen blocking layer 234 corresponding to a central portion of the semiconductor layer 230. The first upper hydrogen capturing layer 236 and the gate electrode 238 may be formed through a single photolithographic process to have the same shape as each other.

The first upper hydrogen capturing layer 236 captures a hydrogen diffused from the gate electrode 238 to the first upper hydrogen capturing layer 236 to prevent diffusion of a hydrogen into the semiconductor layer 230. The first upper hydrogen capturing layer 236 includes a hydrogen capturing material having a negative (−) hydrogen formation energy.

An interlayer insulating layer 240 and a second upper hydrogen blocking layer 242 are sequentially disposed on a whole of the gate electrode 238 and the substrate 220.

The second upper hydrogen blocking layer 242, the interlayer insulating layer 240, the first upper hydrogen blocking layer 234 and the gate insulating layer 232 may have first and second contact holes C1 and C2 exposing both end portions of the semiconductor layer 230, and the second upper hydrogen blocking layer 242, the interlayer insulating layer 240, the first upper hydrogen blocking layer 234, the gate insulating layer 232, the buffer layer 228 and the lower hydrogen blocking layer 226 may have a third contact hole C3 exposing an end portion of the lower hydrogen capturing layer 224.

The second upper hydrogen blocking layer 242 blocks a hydrogen diffused from the second upper hydrogen capturing layer 244 to the second upper hydrogen blocking layer 242 to prevent diffusion of a hydrogen into the semiconductor layer 130.

The second upper hydrogen blocking layer 242 may have a greater hydrogen formation energy than a peripheral insulating layer. For example, the second upper hydrogen blocking layer 242 may have a hydrogen formation energy greater than about 1.0 eV. The second upper hydrogen blocking layer 242 may include a hydrogen blocking material having a hydrogen formation energy greater than about 3.5 eV which is a hydrogen formation energy of silicon oxide ($SiO_2$).

Although the first, second and third contact holes C1, C2 and C3 are formed in the second upper hydrogen blocking layer 242, the interlayer insulating layer 240, the first upper hydrogen blocking layer 234, the gate insulating layer 232, the buffer layer 228 and the lower hydrogen blocking layer 226 through a single photolithographic process in the second embodiment, the first, second and third contact holes C1, C2 and C3 of the second upper hydrogen blocking layer 242, the first, second and third contact holes C1, C2 and C3 of the interlayer insulating layer 240, the gate insulating layer 232 and the buffer layer 228, the first, second and third contact holes C1, C2 and C3 of the first upper hydrogen blocking layer 234 and the first, second and third contact holes C1, C2 and C3 of the lower hydrogen blocking layer 226 may be formed through a photolithographic process different from each other to have a shape different from each other in another embodiment.

A second upper hydrogen capturing layer 244 and a source electrode 246 are sequentially disposed on the second upper hydrogen blocking layer 242 corresponding to one end portion of the semiconductor layer 230, and the second upper hydrogen capturing layer 244 and a drain electrode 248 are sequentially disposed on the second upper hydrogen blocking layer 242 corresponding to the other end portion of the semiconductor layer 230. The second upper hydrogen capturing layer 244 and the source electrode 246 may be formed through a single photolithographic process to have the same shape as each other, and the second upper hydrogen capturing layer 244 and the drain electrode 248 may be formed through a single photolithographic process to have the same shape as each other.

Although the second upper hydrogen capturing layer 244, the source electrode 246 and the drain electrode 248 do not cover and exposes the gate electrode 238 and the semiconductor layer 230 in the second embodiment, the second upper hydrogen capturing layer 244, the source electrode 246 and the drain electrode 248 may cover the gate electrode 238 and the semiconductor layer 230 in another embodiment.

The second hydrogen capturing layer 244 captures a hydrogen diffused from the source electrode 246 and the drain electrode 248 to the second upper hydrogen capturing layer 244 to prevent diffusion of a hydrogen into the semiconductor layer 230. The second upper hydrogen capturing layer 244 includes a hydrogen capturing material having a negative (−) hydrogen formation energy.

The source electrode 246 and the second upper hydrogen capturing layer 244 may be connected to one end portion of the semiconductor layer 230 through the first contact hole C1 of the second upper hydrogen blocking layer 242, the interlayer insulating layer 240, the first upper hydrogen blocking layer 234 and the gate insulating layer 232 and may be connected to one end portion of the lower hydrogen capturing layer 224 and the light shielding layer 222 through the third contact hole C3 of the second upper hydrogen blocking layer 242, the interlayer insulating layer 240, the first upper hydrogen blocking layer 234, the gate insulating layer 232, the buffer layer 228 and the lower hydrogen blocking layer 226. The drain electrode 248 and the second upper hydrogen capturing layer 244 may be connected to the other end portion of the semiconductor layer 230 through the second contact hole C2 of the second upper hydrogen blocking layer 242, the interlayer insulating layer 240, the first upper hydrogen blocking layer 234 and the gate insulating layer 232.

The semiconductor layer 230, the gate electrode 238, the source electrode 246 and the drain electrode 248 constitute a driving thin film transistor (TFT) Tdr.

A passivation layer 250 is disposed on a whole of the source electrode 246, the drain electrode 248 and the substrate 220.

A third upper hydrogen blocking layer 252 is disposed on a whole of the passivation layer 250 and the substrate 220.

The third upper hydrogen blocking layer 252 blocks a hydrogen diffused from the third upper hydrogen capturing layer 256 to the third upper hydrogen blocking layer 252 and a hydrogen diffused to the third upper hydrogen blocking layer 252 through a planarizing layer 254 to prevent diffusion of a hydrogen into the semiconductor layer 230.

The third upper hydrogen blocking layer 252 may have a greater hydrogen formation energy than a peripheral insulating layer. For example, the third upper hydrogen blocking layer 252 may have a hydrogen formation energy greater than about 1.0 eV. The third upper hydrogen blocking layer 252 may include a hydrogen blocking material having a hydrogen formation energy greater than about 3.5 eV which is a hydrogen formation energy of silicon oxide ($SiO_2$).

A planarizing layer 254 is disposed on a whole of the third upper hydrogen blocking layer 252 and the substrate 220.

The planarizing layer 254, the third upper hydrogen blocking layer 252 and the passivation layer 250 have a fourth contact hole C4 exposing the source electrode 246.

Although the fourth contact hole C4 is formed in the planarizing layer 254, the third upper hydrogen blocking layer 252 and the passivation layer 250 through a single photolithographic process in the second embodiment, the fourth contact hole C4 of the planarizing layer 254, the fourth contact hole C4 of the third upper hydrogen blocking layer 252 and the fourth contact hole C4 of the passivation layer 250 may be formed through a photolithographic process different from each other to have a shape different from each other in another embodiment.

A third upper hydrogen capturing layer 256 and a first electrode 258 are sequentially disposed on the planarizing layer 254 in the emission area EA and the circuit area CA of each of the plurality of subpixels SP. The third upper hydrogen capturing layer 256 and the first electrode 258 may be formed through a single photolithographic process to have the same shape as each other.

The third upper hydrogen capturing layer 256 captures a hydrogen diffused from the first electrode 258 to the third upper hydrogen capturing layer 256 to prevent diffusion of a hydrogen into the semiconductor layer 230. The third upper hydrogen capturing layer 256 includes a hydrogen capturing material having a negative (−) hydrogen formation energy.

The first electrode 258 may be an anode supplying a hole to a light emitting layer 262 or a cathode supplying an electron to the light emitting layer 262.

The first electrode 258 and the third upper hydrogen capturing layer 256 are connected to the source electrode 246 through the fourth contact hole C4.

Although the third upper hydrogen capturing layer 256 and the first electrode 258 do not cover and expose the gate electrode 238 and the semiconductor layer 230 in the second embodiment, the third upper hydrogen capturing layer 256 and the first electrode 258 may cover the gate electrode 238 and the semiconductor layer 230 in another embodiment.

A bank layer 260 is disposed on the first electrode 258 and has an open portion exposing the first electrode 258 corresponding to the emission area EA of each of the plurality of subpixels SP.

A light emitting layer 262 is disposed on the first electrode 258 exposed through the open portion of the bank layer 260.

A second electrode 264 is disposed on a whole of the light emitting layer 262 and the substrate 220.

The second electrode 264 may be a cathode supplying an electron to the light emitting layer 262 or an anode supplying a hole to the light emitting layer 262.

The first electrode 258, the light emitting layer 262 and the second electrode 264 constitute a light emitting diode Del.

The lower hydrogen capturing layer 224 and the first, second and third upper hydrogen capturing layers 236, 244 and 256 may include one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

The lower hydrogen blocking layer 226 and the first, second and third upper hydrogen blocking layers 234, 242 and 252 may include one of copper oxide ($CuO_x$), nickel oxide ($NiO_x$), iron oxide ($FeO_x$), cobalt oxide ($CoO_x$), manganese oxide ($MnO_x$), indium oxide ($InO_x$), tin oxide ($SnO_x$), zinc oxide ($ZnO_x$), silver oxide ($AgO_x$), gallium oxide ($GaO_x$) and tungsten oxide ($WO_x$) or one of aluminum oxide ($AlO_x$), magnesium oxide ($MgO_x$) and calcium oxide ($CaO_x$).

In the display device 210, the first upper hydrogen capturing layer 236 is disposed between the gate electrode 238 and the semiconductor layer 230, and the second upper hydrogen capturing layer 244 is disposed between the source and drain electrodes 246 and 248 and the semiconductor layer 230. The third upper hydrogen capturing layer 256 is disposed between the first electrode 258 and the semiconductor layer 230, and the lower hydrogen capturing layer 224 is disposed between the light shielding layer 222 and the semiconductor layer 230. Since the first, second and third upper hydrogen capturing layers 236, 244 and 256 and the lower hydrogen capturing layer 224 capture an external hydrogen or an internal hydrogen of the organic layer or the inorganic layer, a hydrogen diffusion is minimized to prevent deterioration of the semiconductor layer 230. As a result, deterioration of an electric property of the driving TFT Tdr and deterioration of a reliability of the display device 210 are prevented.

Further, the first upper hydrogen blocking layer 234 is disposed between the first upper hydrogen capturing layer 236 and the semiconductor layer 230, and the second upper hydrogen blocking layer 242 is disposed between the second upper hydrogen capturing layer 244 and the semiconductor layer 230. The third upper hydrogen blocking layer 252 is disposed between the third upper hydrogen capturing layer 256 and the semiconductor layer 230, and the lower hydrogen blocking layer 226 is disposed between the lower hydrogen capturing layer 224 and the semiconductor layer 230. Since the first, second and third upper hydrogen blocking layers 234, 242 and 252 and the lower hydrogen blocking layer 226 block an excess hydrogen of the first, second and third upper hydrogen capturing layers 236, 244 and 256 and the lower hydrogen capturing layer 224, a hydrogen diffusion is reduced or minimized to prevent deterioration of the semiconductor layer 230. As a result, deterioration of an electric property of the driving TFT Tdr and deterioration of a reliability of the display device 210 are prevented.

In another embodiment, a source electrode and a drain electrode may be formed as the same layer of the same material as a gate electrode.

Figure 9:
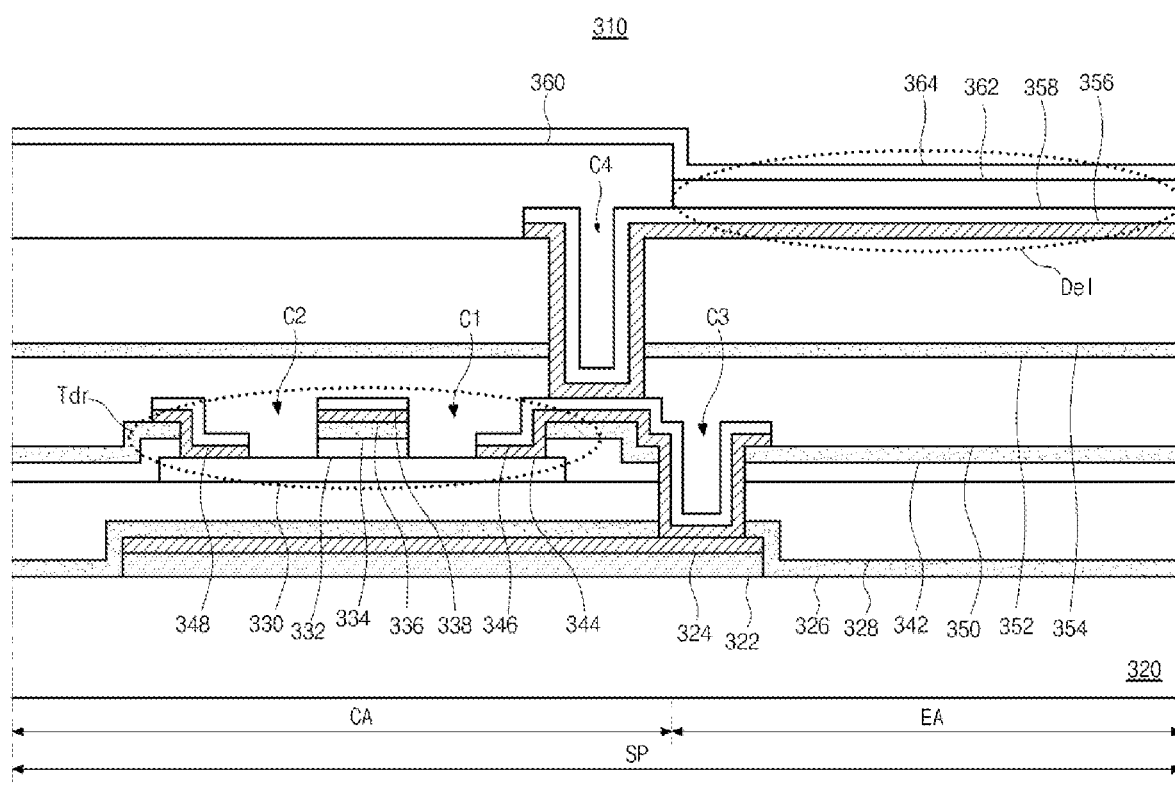
FIG. 9 is a cross-sectional view showing a subpixel of a display device according to a third embodiment of the present disclosure.

FIG. 9 is a cross-sectional view showing a subpixel of a display device according to a third embodiment of the present disclosure. Illustration on a part the same as the first and second embodiments will be omitted.

In FIG. 9, a display device 310 according to a third embodiment of the present disclosure includes a substrate 320, a switching thin film transistor (TFT) (not shown), a driving TFT Tdr, a sensing TFT (not shown), a storage capacitor (not shown) and a light emitting diode (Del).

The substrate 320 includes a plurality of pixels. Each of the plurality of pixels includes a plurality of subpixels SP, and each of the plurality of subpixels SP includes an emission area EA and a circuit area CA.

A light shielding layer 322 and a lower hydrogen capturing layer 324 are sequentially disposed in the circuit area CA of each of the plurality of subpixels SP on the substrate 320. The light shielding layer 322 and the lower hydrogen capturing layer 324 may be formed through a single photolithographic process to have the same shape as each other.

The light shielding layer 322 is disposed to overlap a semiconductor layer 330 of each of the switching TFT, the driving TFT Tdr and the sensing TFT.

The lower hydrogen capturing layer 324 captures a hydrogen (H) diffused from the light shielding layer 322 to the lower hydrogen capturing layer 324 to prevent diffusion of a hydrogen into the semiconductor layer 330. The lower hydrogen capturing layer 324 includes a hydrogen capturing material having a negative (−) hydrogen formation energy.

A lower hydrogen blocking layer 326 is disposed on a whole of the lower hydrogen capturing layer 324 and the substrate 320. The lower hydrogen blocking layer 326 blocks a hydrogen diffused from the lower hydrogen capturing layer 324 to the lower hydrogen blocking layer 326 and a hydrogen diffused from the substrate 320 or an inorganic material layer on the substrate 320 to the lower hydrogen blocking layer 326 to prevent diffusion of a hydrogen into the semiconductor layer 330.

The lower hydrogen blocking layer 326 may have a greater hydrogen formation energy than a peripheral insulating layer. For example, the lower hydrogen blocking layer 326 may have a hydrogen formation energy greater than about 1.0 eV. The lower hydrogen blocking layer 326 may include a hydrogen blocking material having a hydrogen formation energy greater than about 3.5 eV which is a hydrogen formation energy of silicon oxide ($SiO_2$).

A buffer layer 328 is disposed on a whole of the lower hydrogen blocking layer 326 and the substrate 320.

A semiconductor layer 330 is disposed on the buffer layer 328 corresponding to the light shielding layer 322.

For example, the semiconductor layer 330 may include an oxide semiconductor material such as indium gallium zinc oxide (IGZO).

A gate insulating layer 332 is disposed on a whole of the semiconductor layer 330 and the substrate 320, a first upper hydrogen blocking layer 334 is disposed on the gate insulating layer 332 corresponding to a central portion of the semiconductor layer 330, and a second upper hydrogen blocking layer 342 is disposed on the gate insulating layer 332 corresponding to both end portions of the semiconductor layer 330.

The first upper hydrogen blocking layer 334 and the second upper hydrogen blocking layer 342 may have the same layer and the same material as each other.

The first upper hydrogen blocking layer 334 blocks a hydrogen diffused from a first upper hydrogen capturing layer 336 to the first upper hydrogen blocking layer 334 to prevent diffusion of a hydrogen into the semiconductor layer 330. The second upper hydrogen blocking layer 342 blocks a hydrogen diffused from a second upper hydrogen capturing layer 344 to the second upper hydrogen blocking layer 342 to prevent diffusion of a hydrogen into the semiconductor layer 330.

The first upper hydrogen blocking layer 334 and the second upper hydrogen blocking layer 342 may have a greater hydrogen formation energy than a peripheral insulating layer. For example, the first upper hydrogen blocking layer 334 and the second upper hydrogen blocking layer 342 may have a hydrogen formation energy greater than about 1.0 eV. The first upper hydrogen blocking layer 334 and the second upper hydrogen blocking layer 342 may include a hydrogen blocking material having a hydrogen formation energy greater than about 3.5 eV which is a hydrogen formation energy of silicon oxide ($SiO_2$).

The first upper hydrogen blocking layer 334, the second upper hydrogen blocking layer 342 and the gate insulating layer 332 may have first and second contact holes C1 and C2 exposing both end portions of the semiconductor layer 330, and the first upper hydrogen blocking layer 334, the second upper hydrogen blocking layer 342, the gate insulating layer 332, the buffer layer 328 and the lower hydrogen blocking layer 326 may have a third contact hole C3 exposing an end portion of the lower hydrogen capturing layer 324.

Although the first, second and third contact holes C1, C2 and C3 are formed in the first upper hydrogen blocking layer 334, the second upper hydrogen blocking layer 342, the gate insulating layer 332, the buffer layer 328 and the lower hydrogen blocking layer 326 through a single photolithographic process in the third embodiment, the first, second and third contact holes C1, C2 and C3 of the first upper hydrogen blocking layer 334 and the second upper hydrogen blocking layer 342, the first, second and third contact holes C1, C2 and C3 of the gate insulating layer 332 and the buffer layer 328 and the first, second and third contact holes C1, C2 and C3 of the lower hydrogen blocking layer 326 may be formed through a photolithographic process different from each other to have a shape different from each other in another embodiment.

A first upper hydrogen capturing layer 336 and a gate electrode 338 are sequentially disposed on the first upper hydrogen blocking layer 334 corresponding to a central portion of the semiconductor layer 330, a second upper hydrogen capturing layer 344 and a source electrode 346 are sequentially disposed on the second upper hydrogen blocking layer 342 corresponding to one end portion of the semiconductor layer 330, and the second upper hydrogen capturing layer 344 and a drain electrode 348 are sequentially disposed on the second upper hydrogen blocking layer 342 corresponding to the other end portion of the semiconductor layer 330.

The first upper hydrogen capturing layer 336 and the second upper hydrogen capturing layer 344 may have the same layer and the same material as each other. The gate electrode 338, the source electrode 346 and the drain electrode 348 may have the same layer and the same material as each other.

The first upper hydrogen capturing layer 336 and the gate electrode may be formed through a single photolithographic process to have the same shape as each other, the second upper hydrogen capturing layer 344 and the source electrode 346 may be formed through a single photolithographic process to have the same shape as each other, and the second upper hydrogen capturing layer 344 and the drain electrode 348 may be formed through a single photolithographic process to have the same shape as each other.

The first hydrogen capturing layer 336 captures a hydrogen diffused from the gate electrode 338 to the first upper hydrogen capturing layer 336 to prevent diffusion of a hydrogen into the semiconductor layer 330. The first upper hydrogen capturing layer 336 includes a hydrogen capturing material having a negative (−) hydrogen formation energy.

The second hydrogen capturing layer 344 captures a hydrogen diffused from the source electrode 346 and the drain electrode 348 to the second upper hydrogen capturing layer 344 to prevent diffusion of a hydrogen into the semiconductor layer 330. The second upper hydrogen capturing layer 344 includes a hydrogen capturing material having a negative (−) hydrogen formation energy.

The source electrode 346 and the second upper hydrogen capturing layer 344 may be connected to one end portion of the semiconductor layer 330 through the first contact hole C1 of the first upper hydrogen blocking layer 334 and the gate insulating layer 332 and may be connected to one end portion of the lower hydrogen capturing layer 324 and the light shielding layer 322 through the third contact hole C3 of the first upper hydrogen blocking layer 334, the gate insulating layer 332, the buffer layer 328 and the lower hydrogen blocking layer 326. The drain electrode 348 and the second upper hydrogen capturing layer 344 may be connected to the other end portion of the semiconductor layer 330 through the second contact hole C2 of the first upper hydrogen blocking layer 334 and the gate insulating layer 332.

The semiconductor layer 330, the gate electrode 338, the source electrode 346 and the drain electrode 348 constitute a driving thin film transistor (TFT) Tdr.

A passivation layer 350 is disposed on a whole of the source electrode 346, the drain electrode 348 and the substrate 320.

A third upper hydrogen blocking layer 352 is disposed on a whole of the passivation layer 350 and the substrate 320.

The third upper hydrogen blocking layer 352 blocks a hydrogen diffused from the third upper hydrogen capturing layer 356 to the third upper hydrogen blocking layer 352 and a hydrogen diffused to the third upper hydrogen blocking layer 352 through a planarizing layer 354 to prevent diffusion of a hydrogen into the semiconductor layer 330.

The third upper hydrogen blocking layer 352 may have a greater hydrogen formation energy than a peripheral insulating layer. For example, the third upper hydrogen blocking layer 352 may have a hydrogen formation energy greater than about 1.0 eV. The third upper hydrogen blocking layer 352 may include a hydrogen blocking material having a hydrogen formation energy greater than about 3.5 eV which is a hydrogen formation energy of silicon oxide ($SiO_2$).

A planarizing layer 354 is disposed on a whole of the third upper hydrogen blocking layer 352 and the substrate 320.

The planarizing layer 354, the third upper hydrogen blocking layer 352 and the passivation layer 350 have a fourth contact hole C4 exposing the source electrode 346.

Although the fourth contact hole C4 is formed in the planarizing layer 354, the third upper hydrogen blocking layer 352 and the passivation layer 350 through a single photolithographic process in the second embodiment, the fourth contact hole C4 of the planarizing layer 354, the fourth contact hole C4 of the third upper hydrogen blocking layer 352 and the fourth contact hole C4 of the passivation layer 350 may be formed through a photolithographic process different from each other to have a shape different from each other in another embodiment.

A third upper hydrogen capturing layer 356 and a first electrode 358 are sequentially disposed on the planarizing layer 354 in the emission area EA and the circuit area CA of each of the plurality of subpixels SP. The third upper hydrogen capturing layer 356 and the first electrode 358 may be formed through a single photolithographic process to have the same shape as each other.

The third upper hydrogen capturing layer 356 captures a hydrogen diffused from the first electrode 358 to the third upper hydrogen capturing layer 356 to prevent diffusion of a hydrogen into the semiconductor layer 330. The third upper hydrogen capturing layer 356 includes a hydrogen capturing material having a negative (−) hydrogen formation energy.

The first electrode 358 may be an anode supplying a hole to a light emitting layer 362 or a cathode supplying an electron to the light emitting layer 362.

The first electrode 358 and the third upper hydrogen capturing layer 356 are connected to the source electrode 346 through the fourth contact hole C4.

Although the third upper hydrogen capturing layer 356 and the first electrode 358 do not cover and expose the gate electrode 338 and the semiconductor layer 330 in the third embodiment, the third upper hydrogen capturing layer 356 and the first electrode 358 may cover the gate electrode 338 and the semiconductor layer 330 in another embodiment.

A bank layer 360 is disposed on the first electrode 358 and has an open portion exposing the first electrode 358 corresponding to the emission area EA of each of the plurality of subpixels SP.

A light emitting layer 362 is disposed on the first electrode 358 exposed through the open portion of the bank layer 360.

A second electrode 364 is disposed on a whole of the light emitting layer 362 and the substrate 320.

The second electrode 364 may be a cathode supplying an electron to the light emitting layer 362 or an anode supplying a hole to the light emitting layer 362.

The first electrode 358, the light emitting layer 362 and the second electrode 364 constitute a light emitting diode Del.

The lower hydrogen capturing layer 324 and the first and third upper hydrogen capturing layers 336 and 356 may include one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

The lower hydrogen blocking layer 326 and the first and third upper hydrogen blocking layers 334 and 352 may include one of copper oxide ($CuO_x$), nickel oxide ($NiO_x$), iron oxide ($FeO_x$), cobalt oxide ($CoO_x$), manganese oxide ($MnO_x$), indium oxide ($InO_x$), tin oxide ($SnO_x$), zinc oxide ($ZnO_x$), silver oxide ($AgO_x$), gallium oxide ($GaO_x$) and tungsten oxide ($WO_x$) or one of aluminum oxide ($AlO_x$), magnesium oxide ($MgO_x$) and calcium oxide ($CaO_x$).

In the display device 310, the first upper hydrogen capturing layer 336 is disposed between the gate electrode 338 and the semiconductor layer 330 and between the source and drain electrodes 346 and 348 and the semiconductor layer 330, the third upper hydrogen capturing layer 356 is disposed between the first electrode 358 and the semiconductor layer 330, and the lower hydrogen capturing layer 324 is disposed between the light shielding layer 322 and the semiconductor layer 330. Since the first and third upper hydrogen capturing layers 336 and 356 and the lower hydrogen capturing layer 324 capture an external hydrogen or an internal hydrogen of the organic layer or the inorganic layer, a hydrogen diffusion is minimized to prevent deterioration of the semiconductor layer 230. As a result, deterioration of an electric property of the driving TFT Tdr and deterioration of a reliability of the display device 310 are prevented.

Further, the first upper hydrogen blocking layer 334 is disposed between the first upper hydrogen capturing layer 336 and the semiconductor layer 330, the third upper hydrogen blocking layer 352 is disposed between the third upper hydrogen capturing layer 356 and the semiconductor layer 330, and the lower hydrogen blocking layer 326 is disposed between the lower hydrogen capturing layer 324 and the semiconductor layer 330. Since the first and third upper hydrogen blocking layers 334 and 352 and the lower hydrogen blocking layer 326 block an excess hydrogen of the first and third upper hydrogen capturing layers 336 and 356 and the lower hydrogen capturing layer 324, a hydrogen diffusion is minimized to prevent deterioration of the semiconductor layer 330. As a result, deterioration of an electric property of the driving TFT Tdr and deterioration of a reliability of the display device 310 are prevented.

Although the hydrogen capturing layer and the hydrogen blocking layer are applied to the display device such as an organic light emitting diode display device including a thin film transistor in the first, second and third embodiments, the hydrogen capturing layer and the hydrogen blocking layer may be applied to a flat panel display such as a liquid crystal display device including a thin film transistor in another embodiment.

In the display device according to the present disclosure, since a hydrogen capturing layer is disposed between a metal layer and a semiconductor layer, a hydrogen is captured by the hydrogen capturing layer and a hydrogen diffusion is reduced or minimized to prevent deterioration of the semiconductor layer. As a result, deterioration of an electric property of a thin film transistor and deterioration of a reliability of the display device are prevented.

Further, since a hydrogen blocking layer is disposed between a hydrogen capturing layer a semiconductor layer, a hydrogen is blocked by the hydrogen blocking layer and a hydrogen diffusion is reduced or minimized to prevent deterioration of the semiconductor layer. As a result, deterioration of an electric property of a thin film transistor and deterioration of a reliability of the display device are prevented.

It will be apparent to those skilled in the art that various modifications and variation can be made in the present disclosure without departing from the spirit or scope of the disclosure. Thus, it is intended that the present disclosure cover the modifications and variations of the present disclosure provided they come within the scope of the appended claims and their equivalents.

What is claimed is:

1. A display device, comprising:
   a substrate;
   a semiconductor layer on the substrate;
   a gate insulating layer on the semiconductor layer;
   a first upper hydrogen blocking layer on the gate insulating layer and having a positive hydrogen formation energy, wherein the first upper hydrogen blocking layer includes one of cobalt oxide (CoOx), indium oxide (InOx), tin oxide (SnOx), silver oxide (AgOx), and calcium oxide (CaOx);
   a first upper hydrogen capturing layer on the first upper hydrogen blocking layer corresponding to a central portion of the semiconductor layer and having a negative hydrogen formation energy, wherein the first upper hydrogen capturing layer is formed of metal that includes one of vanadium (V), niobium (Nb), hafnium (Hf), zirconium (Zr), cerium (Ce), lanthanum (La), yttrium (Y), scandium (Sc), lithium (Li), and molybdenum titanium (MoTi) and an alloy thereof;
   a gate electrode on the first upper hydrogen capturing layer;
   a source electrode and a drain electrode connected to both end portions of the semiconductor layer;
   a second upper hydrogen capturing layer under each of the source electrode and the drain electrode and having a negative hydrogen formation energy; and
   a passivation layer on the gate electrode, the source electrode, and the drain electrode, wherein the first upper hydrogen blocking layer is in contact with the first upper hydrogen capturing layer formed of the metal, and wherein the first upper hydrogen capturing layer is in contact with the gate electrode, and wherein the second upper hydrogen capturing layer contacts the source electrode and the drain electrode.

2. The device of claim 1, further comprising
a second upper hydrogen blocking layer under the second hydrogen capturing layer and having a positive hydrogen formation energy.

3. The device of claim 2, further comprising:
a first electrode connected to the source electrode;
a third upper hydrogen capturing layer under the first electrode and having a negative hydrogen formation energy; and
a third upper hydrogen blocking layer under the third upper hydrogen capturing layer and having a positive hydrogen formation energy.

4. The device of claim 1, wherein the gate insulating layer, the first upper hydrogen blocking layer, the first upper hydrogen capturing layer, and the gate electrode have a same shape as each other, and wherein both ends of the gate insulating layer, both ends of the first upper hydrogen blocking layer, both ends of the first upper hydrogen capturing layer, and both ends of the gate electrode coincide with each other.

5. The device of claim 2, wherein the first upper hydrogen blocking layer and the second upper hydrogen blocking layer have a same layer and a same material as each other,
wherein the gate electrode, the source electrode and the drain electrode have a same layer and a same material as each other, and
wherein the source electrode and the drain electrode are connected to the both end portions of the semiconductor layer through a first contact hole and a second contact hole, respectively, of the first upper hydrogen blocking layer, the second upper hydrogen blocking layer, and the gate insulating layer.

6. The device of claim 5, wherein the second upper hydrogen capturing layer contacts a top surface of the second upper hydrogen blocking layer, a side surface of the second upper hydrogen blocking layer in the first contact hole and the second contact hole, a side surface of the gate insulating layer in the first contact hole and the second contact hole, and a top surface of the both end portions of the semiconductor layer.

7. The device of claim 6, wherein the source electrode is connected to one end portion of a light shielding layer through a third contact hole of the second upper hydrogen blocking layer, the gate insulating layer, a buffer layer, and a lower hydrogen blocking layer, and
wherein the second upper hydrogen capturing layer contacts a top surface of the second upper hydrogen blocking layer, a side surface of the second upper hydrogen blocking layer in the third contact hole, a side surface of the gate insulating layer in the third contact hole, a side surface of the buffer layer in the third contact hole, a side surface of the lower hydrogen blocking layer in the third contact hole, and a top surface of one end portion of the lower hydrogen capturing layer.

8. The device of claim 1, wherein the first upper hydrogen capturing layer includes a material different from a material included in the gate electrode.

9. The device of claim 2, further comprising an interlayer insulating layer between the gate electrode and the passivation layer,
wherein the second upper hydrogen blocking layer is disposed between the interlayer insulating layer and the passivation layer.

10. A display device, comprising:
a substrate;
a semiconductor layer on the substrate;
a gate insulating layer on the semiconductor layer;
a first upper hydrogen blocking layer on the gate insulating layer and having a positive hydrogen formation energy;
a first upper hydrogen capturing layer on the first upper hydrogen blocking layer corresponding to a central portion of the semiconductor layer and having a negative hydrogen formation energy;
a gate electrode on the first upper hydrogen capturing layer;
a source electrode and a drain electrode connected to both end portions of the semiconductor layer;
a passivation layer on the gate electrode, the source electrode, and the drain electrode;
a second upper hydrogen capturing layer under each of the source electrode and the drain electrode and having a negative hydrogen formation energy;
a second upper hydrogen blocking layer under the second hydrogen capturing layer and having a positive hydrogen formation energy;
a first electrode connected to the source electrode;
a third upper hydrogen capturing layer under the first electrode and having a negative hydrogen formation energy;
a third upper hydrogen blocking layer under the third upper hydrogen capturing layer and having a positive hydrogen formation energy;
a light shielding layer between the substrate and the semiconductor layer;
a lower hydrogen capturing layer between the light shielding layer and the semiconductor layer and having a negative hydrogen formation energy;
a lower hydrogen blocking layer between the lower hydrogen capturing layer and the semiconductor layer and having a positive hydrogen formation energy; and
a buffer layer between the lower hydrogen blocking layer and the semiconductor layer.

11. The device of claim 10, wherein the light shielding layer and the lower hydrogen capturing layer have a same shape as each other.

12. The device of claim 10, wherein each of the lower hydrogen capturing layer and the first, second and third upper hydrogen capturing layers includes one of vanadium (V), niobium (Nb), tantalum (Ta), hafnium (Hf), zirconium (Zr), titanium (Ti), cerium (Ce), lanthanum (La), yttrium (Y), scandium (Sc), lithium (Li) and molybdenum titanium (MoTi) and an alloy thereof.

13. The device of claim 10, wherein each of the lower hydrogen blocking layer and the first upper hydrogen blocking layer, the second upper hydrogen blocking layer, and the third upper hydrogen blocking layer has a hydrogen formation energy greater than 1.0 eV.

14. The device of claim 10, wherein each of the lower hydrogen blocking layer and the first upper hydrogen blocking layer, the second upper hydrogen blocking layer, and the third upper hydrogen blocking layer includes one of copper oxide (CuOx), nickel oxide (NiOx), iron oxide (FeOx), cobalt oxide (CoOx), manganese oxide (MnOx), indium oxide (InOx), tin oxide (SnOx), zinc oxide (ZnOx), silver oxide (AgOx), gallium oxide (GaOx), tungsten oxide (WOx), aluminum oxide (AlOx), magnesium oxide (MgOx) and calcium oxide (CaOx).

15. A display device, comprising:
a substrate;
a semiconductor layer on the substrate;
a gate insulating layer on the semiconductor layer;
a first upper hydrogen blocking layer on the gate insulating layer and having a positive hydrogen formation energy;
a first upper hydrogen capturing layer on the first upper hydrogen blocking layer corresponding to a central portion of the semiconductor layer and having a negative hydrogen formation energy;
a gate electrode on the first upper hydrogen capturing layer;
a source electrode and a drain electrode connected to both end portions of the semiconductor layer;
a passivation layer on the gate electrode, the source electrode, and the drain electrode;
a second upper hydrogen capturing layer under each of the source electrode and the drain electrode and having a negative hydrogen formation energy;
a second upper hydrogen blocking layer under the second hydrogen capturing layer and having a positive hydrogen formation energy;
an interlayer insulating layer between the gate electrode and the passivation layer,
wherein the second upper hydrogen blocking layer is disposed between the interlayer insulating layer and the passivation layer, and
wherein the source electrode and the drain electrode are connected to the both end portions of the semiconductor layer through first and second contact holes, respectively, of the second upper hydrogen blocking layer and the interlayer insulating layer.

16. The device of claim 15, wherein the second upper hydrogen capturing layer contacts a top surface of the second upper hydrogen blocking layer, a side surface of the second upper hydrogen blocking layer in the first contact hole and the second contact hole, a side surface of the interlayer insulating layer in the first contact hole and the second contact hole and a top surface of the both end portions of the semiconductor layer.

17. The device of claim 16, wherein the source electrode is connected to one end portion of a light shielding layer through a third contact hole of the second upper hydrogen blocking layer, the interlayer insulating layer, a buffer layer, and a lower hydrogen blocking layer, and
wherein the second upper hydrogen capturing layer contacts a top surface of the second upper hydrogen blocking layer, a side surface of the second upper hydrogen blocking layer in the third contact hole, a side surface of the interlayer insulating layer in the third contact hole, a side surface of the buffer layer in the third contact hole, a side surface of the lower hydrogen blocking layer in the third contact hole, and a top surface of one end portion of the lower hydrogen capturing layer.

18. A display device, comprising:
a substrate;
a semiconductor layer on the substrate;
a gate insulating layer on the semiconductor layer;
a first upper hydrogen blocking layer on the gate insulating layer and having a positive hydrogen formation energy;
a first upper hydrogen capturing layer on the first upper hydrogen blocking layer corresponding to a central portion of the semiconductor layer and having a negative hydrogen formation energy;
a gate electrode on the first upper hydrogen capturing layer;
a source electrode and a drain electrode connected to both end portions of the semiconductor layer;
a passivation layer on the gate electrode, the source electrode, and the drain electrode;
a second upper hydrogen capturing layer under each of the source electrode and the drain electrode and having a negative hydrogen formation energy;
a second upper hydrogen blocking layer under the second hydrogen capturing layer and having a positive hydrogen formation energy;
an interlayer insulating layer between the gate electrode and the passivation layer,
wherein the first upper hydrogen blocking layer is disposed between the gate insulating layer and the interlayer insulating layer,
wherein the second upper hydrogen blocking layer is disposed between the interlayer insulating layer and the passivation layer, and
wherein the source electrode and the drain electrode are connected to the both end portions of the semiconductor layer through the first contact hole and the second contact hole, respectively, of the second upper hydrogen blocking layer, the interlayer insulating layer, the first upper hydrogen blocking layer, and the gate insulating layer.

19. The device of claim 18, wherein the second upper hydrogen capturing layer contacts a top surface of the second upper hydrogen blocking layer, a side surface of the second upper hydrogen blocking layer in the first contact hole and the second contact hole, a side surface of the interlayer insulating layer in the first contact hole and the second contact hole, a side surface of the gate insulating layer in the first contact hole and the second contact hole and a top surface of the both end portions of the semiconductor layer.

20. The device of claim 19, wherein the source electrode is connected to one end portion of a light shielding layer through a third contact hole of the second upper hydrogen blocking layer, the interlayer insulating layer, the first upper hydrogen blocking layer, the gate insulating layer, a buffer layer, and a lower hydrogen blocking layer, and
wherein the second upper hydrogen capturing layer contacts a top surface of the second upper hydrogen blocking layer, a side surface of the second upper hydrogen blocking layer in the third contact hole, a side surface of the interlayer insulating layer in the third contact hole, a side surface of the first upper hydrogen blocking layer in the third contact hole, a side surface of the gate insulating layer in the third contact hole, a side surface of the buffer layer in the third contact hole, a side surface of the lower hydrogen blocking layer in the third contact hole, and a top surface of one end portion of the lower hydrogen capturing layer.

* * * * *